United States Patent
Nishiyama et al.

(10) Patent No.: US 9,822,248 B2
(45) Date of Patent: Nov. 21, 2017

(54) POLYSILOXANE COMPOSITION, HARDENED MATERIAL AND OPTICAL DEVICE

(75) Inventors: Yoshitaka Nishiyama, Settsu (JP); Hiroyuki Tanaka, Settsu (JP); Satoshi Sugiyama, Settsu (JP); Takao Manabe, Settsu (JP)

(73) Assignee: KANEKA CORPORATION, Osaka-shi (JP)

(*) Notice: Subject to any disclaimer, the term of this patent is extended or adjusted under 35 U.S.C. 154(b) by 0 days.

(21) Appl. No.: 13/700,622

(22) PCT Filed: May 23, 2011

(86) PCT No.: PCT/JP2011/061757
§ 371 (c)(1),
(2), (4) Date: Feb. 6, 2013

(87) PCT Pub. No.: WO2011/148896
PCT Pub. Date: Dec. 1, 2011

(65) Prior Publication Data
US 2013/0131264 A1 May 23, 2013

(30) Foreign Application Priority Data

May 28, 2010 (JP) .................... 2010-123277
Jul. 5, 2010 (JP) .................... 2010-153296
Feb. 24, 2011 (JP) .................... 2011-038456

(51) Int. Cl.
| | | |
|---|---|---|
| C08L 43/04 | (2006.01) | |
| C08G 77/38 | (2006.01) | |
| C08L 83/14 | (2006.01) | |
| C08K 5/5425 | (2006.01) | |
| H01L 33/56 | (2010.01) | |
| C08G 77/20 | (2006.01) | |

(52) U.S. Cl.
CPC .............. *C08L 43/04* (2013.01); *C08G 77/38* (2013.01); *C08K 5/5425* (2013.01); *C08L 83/14* (2013.01); *C08G 77/20* (2013.01); *C08K 2201/008* (2013.01); *C08L 2201/02* (2013.01); *C08L 2201/14* (2013.01); *C08L 2203/206* (2013.01); *C08L 2205/025* (2013.01); *H01L 33/56* (2013.01)

(58) Field of Classification Search
CPC ........ C08G 77/12; C08G 77/18; C08G 77/20; C08G 77/24; C08G 77/50; C08G 77/442; C08L 83/50; C08L 83/05; C08L 83/07; C08L 83/14; C08F 283/12; C08F 283/124; H01L 33/56
USPC ....... 556/460, 456; 528/31, 32, 37; 525/474, 525/477, 478, 479; 106/287.15; 524/588
See application file for complete search history.

(56) References Cited

U.S. PATENT DOCUMENTS

| | | |
|---|---|---|
| 4,618,657 A | 10/1986 | Katchko et al. |
| 5,047,492 A | 9/1991 | Weidner et al. |
| 5,160,787 A | 11/1992 | Gaku et al. |
| 5,939,576 A | 8/1999 | Lichtenhan et al. |
| 6,127,503 A | 10/2000 | Fujioka et al. |
| 6,252,030 B1 | 6/2001 | Zank et al. |
| 6,623,711 B2 | 9/2003 | Lyu et al. |
| 8,299,198 B2 | 10/2012 | Manabe et al. |
| 8,399,592 B2 | 3/2013 | Manabe et al. |
| 2003/0105246 A1 | 6/2003 | Andoh et al. |
| 2004/0116566 A1 | 6/2004 | Fehn |
| 2005/0173780 A1 | 8/2005 | Sethumadhavan et al. |
| 2006/0052623 A1 | 3/2006 | Yoshida et al. |
| 2006/0074213 A1 | 4/2006 | Kiyomori et al. |
| 2006/0122351 A1 | 6/2006 | Laine et al. |
| 2007/0045619 A1 | 3/2007 | Park et al. |
| 2007/0088094 A1 | 4/2007 | Tamaki et al. |
| 2008/0020213 A1 | 1/2008 | Lichtenhan et al. |
| 2008/0090986 A1 | 4/2008 | Khanarian et al. |
| 2009/0225640 A1 | 9/2009 | Manabe et al. |

(Continued)

FOREIGN PATENT DOCUMENTS

| | | |
|---|---|---|
| CN | 101548398 A | 9/2009 |
| CN | 101568546 A | 10/2009 |

(Continued)

OTHER PUBLICATIONS

Velderrain, et al. (Moisture Permeability of Silicone Systems Guidleines for Choosing a Silicone based on Water Vapor Transmission Rates for Barrier Applications, NuSil Technology, Mar. 4, 2011).*

(Continued)

*Primary Examiner* — Christopher M Rodd
(74) *Attorney, Agent, or Firm* — Westerman, Hattori, Daniels & Adrian

(57) ABSTRACT

The present invention aims to provide a polysiloxane composition which exhibits high heat and light resistance, and excellent gas-barrier properties. The polysiloxane composition of the present invention includes: (A) a modified polyhedral polysiloxane which is obtained by modifying (a) an alkenyl group-containing polyhedral polysiloxane compound with (b) a hydrosilyl group-containing compound; and (B) an organopolysiloxane containing at least two alkenyl groups in a molecule, wherein the polysiloxane composition after curing has a water vapor permeability of not more than 30 $g/m^2/24$ h, and the polysiloxane composition includes (B1) an aryl group-containing organopolysiloxane as the organopolysiloxane (B), and/or (C) a component which is (C1) an organosilicon compound that contains one alkenyl or hydrosilyl group in a molecule, or (C2) a cyclic olefin compound that contains one carbon-carbon double bond in a molecule.

17 Claims, No Drawings

(56) References Cited

U.S. PATENT DOCUMENTS

| | | | |
|---|---|---|---|
| 2010/0063221 A1 | 3/2010 | Manabe et al. | |
| 2010/0099790 A1 | 4/2010 | Manabe et al. | |
| 2011/0001190 A1 | 1/2011 | Ide et al. | |
| 2011/0251357 A1 | 10/2011 | Laine et al. | |
| 2013/0131264 A1* | 5/2013 | Nishimiya | C08L 83/14 524/588 |
| 2013/0165611 A1 | 6/2013 | Manabe et al. | |
| 2013/0192491 A1 | 8/2013 | Nishiyama et al. | |

FOREIGN PATENT DOCUMENTS

| | | |
|---|---|---|
| EP | 0 348 705 A2 | 1/1990 |
| EP | 2151433 A1 | 2/2010 |
| EP | 2151443 A1 | 2/2010 |
| JP | 2-067290 A | 3/1990 |
| JP | 02-067290 A | 3/1990 |
| JP | 06-329687 A | 11/1994 |
| JP | 11-071462 A | 3/1999 |
| JP | 11-124502 A | 5/1999 |
| JP | 2000-154252 A | 6/2000 |
| JP | 2000-265066 A | 9/2000 |
| JP | 2002-363414 A | 12/2002 |
| JP | 2003-137944 A | 5/2003 |
| JP | 2004-123936 A | 4/2004 |
| JP | 2004-143449 A | 5/2004 |
| JP | 2004-175887 A | 6/2004 |
| JP | 2004-529984 A | 9/2004 |
| JP | 2004-359933 A | 12/2004 |
| JP | 2005-023256 A | 1/2005 |
| JP | 2005-290352 A | 10/2005 |
| JP | 2006-022207 A | 1/2006 |
| JP | 2006-104325 A | 4/2006 |
| JP | 2006-131850 A | 5/2006 |
| JP | 2006-233155 A | 9/2006 |
| JP | 2006-265514 A | 10/2006 |
| JP | 2006-269402 A | 10/2006 |
| JP | 2006-299149 A | 11/2006 |
| JP | 2006-299150 A | 11/2006 |
| JP | 2007-031619 A | 2/2007 |
| JP | 2007-31619 A | 2/2007 |
| JP | 2007-091935 A | 4/2007 |
| JP | 2007-169427 A | 7/2007 |
| JP | 2008-163260 A | 7/2008 |
| JP | 2008-291137 A | 12/2008 |
| JP | 2009-173759 A | 8/2009 |
| JP | 2009-173789 A | 8/2009 |
| JP | 2009-206124 A | 9/2009 |
| JP | 2010-031254 A | 2/2010 |
| JP | 2010-095616 A | 4/2010 |
| JP | 2010-254927 A | 11/2010 |
| JP | 2010-265410 A | 11/2010 |
| JP | 2011-006546 A | 1/2011 |
| JP | 2011-016968 A | 1/2011 |
| JP | 2011-042732 A | 3/2011 |
| JP | 2011-068753 A | 4/2011 |
| JP | 2012-180513 A | 9/2012 |
| WO | 03/042292 A2 | 5/2003 |
| WO | 2004/011525 A1 | 2/2004 |
| WO | 2004/022231 A1 | 3/2004 |
| WO | 2004/024741 A1 | 3/2004 |
| WO | 2006/062219 A1 | 6/2006 |
| WO | 2007/022367 A2 | 2/2007 |
| WO | 2008/010545 A1 | 1/2008 |
| WO | 2008/063884 A1 | 5/2008 |
| WO | 2008/066116 A1 | 6/2008 |
| WO | 2008/133138 A1 | 11/2008 |
| WO | 2011/148896 A1 | 12/2011 |

OTHER PUBLICATIONS

Zhang, ("The Permeability Characteristics of Silicone Rubber", 2006 SAMPE Fall Technical Conference, "Global Advances in Materials and Process Engineering", proceedings, Coatings and Sealants Section, Nov. 6-9, 2006, Dallas, TX).*

International Preliminary Report on Patentability (Form PCT/IB/373) of International Application No. PCT/JP2011/061757 dated Dec. 4, 2012 with Form PCT/ISA/273, English translation Only.
International Search Report for PCT/JP2011/061757, dated Sep. 6, 2011.
Zhang, Chunxin et al., "Highly Porous Polyhedral Silsesquioxane Polymers. Synthesis and Characterization", J. Am. Chem. Soc., 1998, vol. 120, pp. 8380-8391 (12 pages).
Laine, Richard M. et al., "Polyfunctional Cubic Silsesquioxanes as Building Blocks for Organic/Inorganic Hybrids", Applied Organometallic Chemistry, 1998, vol. 12, pp. 715-723 (9 pages).
Sellinger, Alan et al., "Silsesquioxanes as Synthetic Platforms. Thermally Curable and Photocurable Inorganic/Organic Hybrids", Macromolecules, 1996, vol. 29, pp. 2327-2330 (4 pages).
Li, Guizhi et al., "Polyhedral Oligomeric Silsesquioxane (POSS) Polymers and Copolymers: A Review", Journal of Inorganic and Organometallic Polymers, 2001, vol. 11, No. 3, pp. 123-154 (32 pages).
International Preliminary Report on Patentability (Form PCT/IB/373) of International Application No. PCT/JP2007/064233 dated Jan. 29, 2009, with Form PCT/ISA/237 (7 pages) (U.S. Appl. No. 12/305,544).
International Search Report dated Oct. 9, 2007, issued in International Application No. PCT/JP2007/064233 (5 pages) (U.S. Appl. No. 12/305,544).
International Preliminary Report on Patentability (Form PCT/IB/373) of International Application No. PCT/JP2008/057415 dated Nov. 10, 2009, with Form PCT/ISA/237 (5 pages) (U.S. Appl. No. 12/450,905).
International Search Report dated Jun. 10, 2008 issued in International Application No. PCT/JP2008/057415 (2 pages) (U.S. Appl. No. 12/450,905).
English Translation of Japanese patent publication 11-124502, date of publication May 11, 1999 (6 pages).
International Preliminary Report on Patentability (Form PCT/IB/373) of International Application No. PCT/JP2011/070854 dated Apr. 16, 2013, with Form PCT/ISA/237 (6 pages) (U.S. Appl. No. 13/823,497).
U.S. Office Action dated Jun. 11, 2014, issued in U.S. Appl. No. 13/796,186 (19 pages).
Lin, Yuan-Chang, et al., "LED and Optical Device Packaging and Materials", Materials for Advanced Packaging, Chapter 18, 2009, pp. 629-680, Cited in US Office Action dated Jun. 9, 2014 and CN Office Action dated Aug. 26, 2014.
U.S. Office Action dated Nov. 6, 2014, issued in related U.S. Appl. No. 13/796,186.
Velderrain, "Designing low permeability, optical-grade silicone systems—Guidelines for choosing a silicone based on transmission rates for barrier applications", NuSil Technology Technical Publication, Jan. 26, 2012, Cited in Office Action dated May 20, 2015, issued in U.S. Appl. No. 13/823,497 (10 pages).
Velderrain, "Moisture Permeability of Silicone Systems Case Study #1: Water Vapor Transmission Rate as Influenced by Durometer, Silica and Organic-Siloxane Group", NuSil Technology Technical Publication, Jun. 24, 2009, Cited in Office Action dated May 20, 2015, issued in U.S. Appl. No. 13/823,497 (15 pages).
Paul A. J. et al., "Synthesis of highly functionalised dendrimers based on polyhedral silsesquioxane cores" J. Chem. Soc., Dalton Trans., 1998, pp. 2767-2770, XP-00.2262722, cited in European Office Action dated Feb. 5, 2015, issued in corresponding EP Patent Application No. 14153400.8 (4 pages).
Mason, M. et al, "The Settling of Small Particles in a Fluid", Physical Review, Oct. 1923, vol. 23, pp. 412-426, cited in US Office Action dated Sep. 15, 2016.
Office Action dated Dec. 4, 2015, issued in relevant U.S. Appl. No. 14/689,424. (11 pages).
Office Action dated Dec. 3, 2015, issued in relevant U.S. Appl. No. 14/689,454. (7 pages).
Riegler, Bill er al., Phosphors and Silicone Dispersions, Creative Partners in a Material World, Mar. 2, 2005. 18 pages).

* cited by examiner

POLYSILOXANE COMPOSITION, HARDENED MATERIAL AND OPTICAL DEVICE

TECHNICAL FIELD

The present invention relates to a polysiloxane composition which exhibits high heat and light resistance, and excellent gas-barrier properties; and a cured article and optical device formed from the polysiloxane composition.

BACKGROUND ART

Polysiloxane compositions are used in various industries because of their excellence in heat resistance, cold resistance, weather resistance, light resistance, chemical stability, electrical characteristics, flame retardancy, water resistance, transparency, colorability, anti-adhesive properties, and anti-corrosive properties. In particular, compositions including a polyhedral polysiloxane are known for their greater excellence in heat resistance, light resistance, chemical stability, low dielectricity and the like due to their specific chemical structures. Therefore, these compositions are expected to be used in various applications.

Some of the applications of polyhedral polysiloxanes are intended for the application as encapsulants for optical elements. For example, Patent Literature 1 discloses a polysiloxane composition having a polyhedral skeleton, which contains a polyhedral polysiloxane resin containing at least two oxetanyl groups, an aliphatic hydrocarbon containing at least one epoxy group, and a cationic polymerization initiator. This material has high refractive index and high light extraction efficiency. However, since the disclosed polysiloxane composition contains oxetanyl and epoxy groups, its heat resistance and light resistance are low. Therefore, the composition especially has difficulty in applications requiring high heat and light resistance, such as white LEDs.

In order to solve such a problem, for example, Patent Literature 2 discloses limiting the glass transition temperature of a polyorganopolysiloxane containing an epoxy group, to improve the heat and light resistance. This material is also thought to have less tendency to crack even after a thermal shock test. However, this material still has difficulty in applications requiring high heat and light resistance, such as white LEDs, and its crack resistance has not reached a sufficient level.

In addition, polysiloxane compositions generally have a problem of low gas-barrier properties in spite of their excellence in other properties. This problem causes another problem in which if a polysiloxane composition with low gas-barrier properties is used as an encapsulant of a reflector, the reflector turns black due to sulfide. In order to deal with this problem, for example, Patent Literature 3 discloses coating metal members with an acrylic resin having high gas-barrier properties before encapsulating them with a silicone resin. However, the silicone resin itself used in this technique has low gas-barrier properties, and this technique also has a problem with productivity in that it requires additional work such as an additional process of encapsulating with a silicone resin after coating with an acrylic resin.

Patent Literature 4 discloses a composition which includes a modified polyhedral polysiloxane. This composition is excellent in moldability, transparency, heat and light resistance, and adhesion, and thus can be used as an encapsulant for optical use. However, there is still scope for further improvement in gas-barrier properties.

As described above, although there are some disclosures of materials including polysiloxanes, there has been found no disclosure of a material having excellent gas-barrier properties while keeping high heat and light resistance. Accordingly, developing a new material is desired.

CITATION LIST

Patent Literature

Patent Literature 1: JP 2008-163260 A
Patent Literature 2: JP 2007-169427 A
Patent Literature 3: JP 2009-206124 A
Patent Literature 4: WO 08/010545

SUMMARY OF INVENTION

Technical Problem

The present invention provides: a polysiloxane composition having high heat and light resistance, and excellent gas-barrier properties; and a cured article and optical device formed from the polysiloxane composition.

Solution to Problem

The present inventors conducted intensive studies for solving the above problems, and completed a polysiloxane composition, a cured article, and an optical device which have the following features.

(1) A polysiloxane composition, including:
(A) a modified polyhedral polysiloxane which is obtained by modifying (a) an alkenyl group-containing polyhedral polysiloxane compound with (b) a hydrosilyl group-containing compound; and
(B) an organopolysiloxane that contains at least two alkenyl groups in a molecule,
wherein the polysiloxane composition after curing has a water vapor permeability of not more than 30 g/m$^2$/24 h, and
the polysiloxane composition includes:
(B1) an aryl group-containing organopolysiloxane as the organopolysiloxane (B), and/or
(C) a component which is (C1) an organosilicon compound that contains one alkenyl or hydrosilyl group in a molecule, or (C2) a cyclic olefin compound that contains one carbon-carbon double bond in a molecule.

(2) The polysiloxane composition according to (1), wherein the modified polyhedral polysiloxane (A) is in a liquid form at 20° C.

(3) The polysiloxane composition according to (1) or (2), wherein the hydrosilyl group-containing compound (b) is a hydrosilyl group-containing cyclic siloxane.

(4) The polysiloxane composition according to any one of (1) to (3),
wherein the hydrosilyl group-containing compound (b) is a hydrosilyl group-terminated straight-chain siloxane.

(5) The polysiloxane composition according to any one of (1) to (4),
wherein the alkenyl group-containing polyhedral polysiloxane compound (a) includes a siloxane unit represented by the following formula:

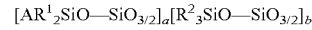

wherein a+b is an integer of 6 to 24, provided that a represents an integer of 1 or more, and b represents an integer of 0 or 1 or more; A represents an alkenyl group; R$^1$ represents an alkyl group or an aryl group; R$^2$ represents a hydrogen atom, an alkyl group, an aryl group, or a group bonded to another polyhedral polysiloxane.

(6) The polysiloxane composition according to any one of (1) to (5),
wherein the modified polyhedral polysiloxane (A) is obtained by adding to the alkenyl group-containing polyhedral polysiloxane compound (a) an excessive amount of the hydrosilyl group-containing compound (b) such that the number of hydrogen atoms directly bonded to Si atoms of the compound (b) is 2.5 to 20 per alkenyl group of the polyhedral polysiloxane compound (a), to carry out the modification, and then evaporating an unreacted portion of the hydrosilyl group-containing compound (b).

(7) The polysiloxane composition according to any one of (1) to (6),
wherein the modified polyhedral polysiloxane (A) contains at least three hydrosilyl groups in a molecule.

(8) The polysiloxane composition according to any one of (1) to (7),
wherein the modified polyhedral polysiloxane (A) includes a structural unit represented by the following formula:

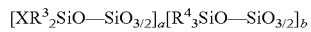

wherein a+b is an integer of 6 to 24, provided that a represents an integer of 1 or more, and b represents an integer of 0 or 1 or more; $R^3$ represents an alkyl group or an aryl group; $R^4$ represents an alkenyl group, a hydrogen atom, an alkyl group, an aryl group, or a group bonded to another polyhedral polysiloxane; and X has a structure represented by the following formula (1) or (2), and in the case where multiple Xs are present, the structures of the Xs may be the same as or different from one another:

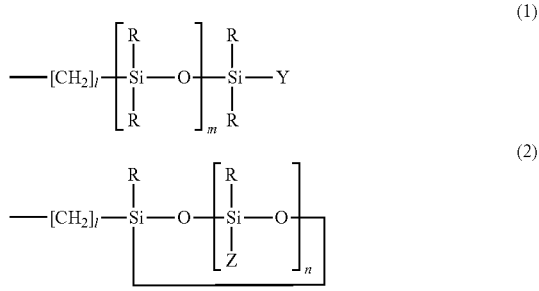

wherein l represents an integer of 2 or more; m represents an integer of 0 or more; n represents an integer of 2 or more; Y represents a hydrogen atom, an alkenyl group, an alkyl group, an aryl group, or a moiety bonded to a polyhedral polysiloxane via an alkylene chain, and Ys may be the same as or different from one another; Z represents a hydrogen atom, an alkenyl group, an alkyl group, an aryl group, or a moiety bonded to a polyhedral polysiloxane via an alkylene chain, and Zs may be the same as or different from one another, provided that at least one of Y and Z is a hydrogen atom.

(9) The polysiloxane composition according to any one of (1) to (8),
wherein the aryl group-containing organopolysiloxane (B1) has a weight-average molecular weight of 3500 or less.

(10) The polysiloxane composition according to any one of (1) to (9),
wherein the organosilicon compound (C1) contains at least one aryl group.

(11) The polysiloxane composition according to any one of (1) to (9),
wherein the cyclic olefin compound (C2) has a weight-average molecular weight of less than 1000.

(12) The polysiloxane composition according to any one of (1) to (9) and (11),
wherein the cyclic olefin compound (C2) is represented by the formula: $C_nH_{2(n-x)}$
wherein n represents an integer of 4 to 20, and x represents an integer of 1 to 5, provided that n−x is an integer of 3 or more.

(13) The polysiloxane composition according to any one of (1) to (12), including a hydrosilylation catalyst.

(14) The polysiloxane composition according to any one of (1) to (13), including a curing retardant.

(15) The polysiloxane composition according to any one of (1) to (14), including an adhesion promoter.

(16) The polysiloxane composition according to any one of (1) to (15), including an inorganic filler.

(17) A cured article, obtained by using the polysiloxane composition according to any one of (1) to (16).

(18) The cured article according to (17),
wherein the cured article has at least one loss tangent peak measured at a frequency of 10 Hz in a temperature range of −40° C. to 50° C., and has a storage elastic modulus at 50° C. of 10 MPa or lower.

(19) An optical device, obtained by using the polysiloxane composition according to any one of (1) to (16).

(20) The optical device according to (19), including an encapsulant for optical elements which is obtained by using the polysiloxane composition.

Advantageous Effects of Invention

The present invention can provide a polysiloxane composition having high heat and light resistance, and excellent gas-barrier properties; and a cured article and optical device formed from the polysiloxane composition.

DESCRIPTION OF EMBODIMENTS

The polysiloxane composition of the present invention, after curing, has a water vapor permeability of 30 g/m²/24 h or less. The water vapor permeability is preferably 20 g/m²/24 h or less.

The water vapor permeability can be determined according to the following method.

On a 5-cm-square glass plate (thickness: 0.5 mm), a 5-cm-square sheet of polyisobutylene rubber (thickness: 3 mm, a 3-cm-square part inside the sheet has been cut out to make a hollow square) is fixed to prepare a jig. The hollow part is filled with 1 g of calcium chloride (for water content measurement, product of Wako Pure Chemical Industries, Ltd.) to prepare a specimen. Further, a 5-cm-square cured article (thickness: 2 mm) for evaluation is fixed thereon, and the resulting specimen is aged in a constant temperature and humidity chamber (PR-2 KP, product of Espec Corporation) at a temperature of 40° C. and a humidity of 90% RH for 24 hours. The water vapor permeability can be calculated according to the following equation:

Water vapor permeability (g/m²/24 h)=[(Total weight (g) of specimen after water vapor permeability test)−(Total weight (g) of specimen before water vapor permeability test)]×10000/9 cm².

The polysiloxane composition of the present invention, after curing, has a water vapor permeability of 30 g/m²/24 h or less, which means that it has a satisfactory low water vapor permeability. Thus, the polysiloxane composition is particularly useful as an encapsulant for LEDs. Specifically, a composition with a water vapor permeability of 30 g/m²/24 h or less can reduce permeation of gas such as oxygen and hydrogen sulfide, as well as water. Accordingly, corrosion is less likely to occur in LED components such as a silver lead frame and reflector, which is expected to contribute to enhancement of durability of LEDs.

<(a) Alkenyl Group-Containing Polyhedral Polysiloxane Compound>

The alkenyl group-containing polyhedral polysiloxane compound (a) in the present invention may be any type of polysiloxane as long as it has a polyhedral skeleton and contains an alkenyl group in a molecule.

More specifically, preferred are alkenyl group-containing polyhedral polysiloxane compounds including a siloxane unit represented by the following formula:

$$[R^5SiO_{3/2}]_x[R^6SiO_{3/2}]_y$$

wherein x+y is an integer of 6 to 24, provided that x represents an integer of 1 or more, and y represents an integer of 0 or 1 or more; $R^5$ represents an alkenyl group or a group containing an alkenyl group; and $R^6$ represents any organic group or a group bonded to another polyhedral polysiloxane.

Other preferred examples include alkenyl group-containing polyhedral polysiloxane compounds including a siloxane unit represented by the following formula:

$$[AR^1_2SiO\text{—}SiO_{3/2}]_a[R^2_3SiO\text{—}SiO_{3/2}]_b$$

wherein a+b is an integer of 6 to 24, provided that a represents an integer of 1 or more, and b represents an integer of 0 or 1 or more; A represents an alkenyl group; $R^1$ represents an alkyl or aryl group; $R^2$ represents a hydrogen atom, an alkyl group, an aryl group, or a group bonded to another polyhedral polysiloxane.

Examples of the alkenyl group include vinyl, allyl, butenyl, and hexenyl groups. Among these, a vinyl group is preferred in terms of the heat and light resistance.

$R^1$ represents an alkyl or aryl group. Specific examples of the alkyl group include methyl, ethyl, propyl, butyl, cyclohexyl, and cyclopentyl groups. Specific examples of the aryl group include phenyl and tolyl groups. $R^1$ in the present invention is preferably a methyl group in terms of the heat and light resistance.

$R^2$ represents a hydrogen atom, an alkyl group, an aryl group, or a group bonded to another polyhedral polysiloxane. Specific examples of the alkyl group include methyl, ethyl, propyl, butyl, cyclohexyl, and cyclopentyl groups. Specific examples of the aryl group include phenyl and tolyl groups. $R^2$ in the present invention is preferably a methyl group in terms of the heat and light resistance.

The numerical number represented by a is not particularly limited as long as it is an integer of 1 or more. It is preferably an integer of 2 or more, more preferably 3 or more, in terms of the handleability of the compound and physical properties of the cured article to be obtained. The numerical number represented by b is not particularly limited as long as it is an integer of 0 or 1 or more.

The sum of a and b (=a+b) is preferably an integer of 6 to 24. The sum is more preferably an integer of 6 to 12, and still more preferably an integer of 6 to 10, in terms of the stability of the compound and of the cured article to be obtained.

The method of synthesis of the alkenyl group-containing polyhedral polysiloxane (a) is not particularly limited, and a known synthesis method may be employed. An example of the synthesis method is a method that involves a hydrolytic condensation reaction of a silane compound represented by the formula: $R^7SiX^a_3$, wherein $R^7$ represents the above-mentioned $R^5$ or $R^6$, $X^a$ represents a halogen atom or a hydrolyzable functional group such as an alkoxy group. Another known method is such that a trisilanol compound that contains three silanol groups in a molecule is synthesized by a hydrolytic condensation reaction of a compound represented by $R^7SiX^a_3$, and the synthesized trisilanol compound is then reacted with a trifunctional silane compound that is the same as or different from the former to close the ring, whereby a polyhedral polysiloxane is synthesized.

Still another example may be a method that involves hydrolytic condensation of a tetraalkoxysilane such as tetraethoxysilane in the presence of a base such as quaternary ammonium hydroxide. In this synthesis method, the hydrolytic condensation reaction of a tetraalkoxysilane produces a polyhedral silicate, and a further reaction of the resulting silicate with a silylating agent such as an alkenyl group-containing silyl chloride can produce a polyhedral polysiloxane in which Si atoms forming a polyhedral structure and an alkenyl group are bonded via siloxane bonds. In the present invention, the tetraalkoxysilane may be replaced by silica or a material containing silica such as rice husk to produce a similar polyhedral polysiloxane.

<(b) Hydrosilyl Group-Containing Compound>

The hydrosilyl group-containing compound used in the present invention is not particularly limited as long as it contains one or more hydrosilyl groups in a molecule. It is preferably a hydrosilyl group-containing siloxane compound, and more preferably a hydrosilyl group-containing cyclic siloxane or straight-chain polysiloxane, in terms of the transparency, heat and light resistance of the modified polyhedral polysiloxane to be obtained. Each of these hydrosilyl group-containing compounds may be used alone, or two or more of them may be used in combination.

Examples of the hydrosilyl group-containing straight-chain polysiloxane include copolymers containing dimethylsiloxane units, methylhydrogensiloxane units, and terminal trimethylsiloxy units; copolymers containing diphenylsiloxane units, methylhydrogensiloxane units, and terminal trimethylsiloxy units; copolymers containing methylphenylsiloxane units, methylhydrogensiloxane units, and terminal trimethylsiloxy units; dimethylhydrogensilyl group-terminated polydimethylsiloxanes; dimethylhydrogensilyl group-terminated polydiphenylsiloxanes; and dimethylhydrogensilyl group-terminated polymethylphenylsiloxanes.

In particular, in terms of the reactivity in modification, heat and light resistance of the cured article to be obtained, and the like, dimethylhydrogensilyl group-terminated polysiloxanes, more preferably, dimethylhydrogensilyl group-terminated polydimethylsiloxanes can be suitably used as the hydrosilyl group-containing straight-chain polysiloxane. Specific preferred examples thereof include tetramethyldisiloxane and hexamethyltrisiloxane.

Examples of the hydrosilyl group-containing cyclic siloxane include 1,3,5,7-tetrahydrogen-1,3,5,7-tetramethylcyclotetrasiloxane, 1-propyl-3,5,7-trihydrogen-1,3,5,7-tetramethylcyclotetrasiloxane, 1,5-dihydrogen-3,7-dihexyl-1,3,5,7-tetramethylcyclotetrasiloxane, 1,3,5-trihydrogen-1,3,5-trimethylcyclosiloxane, 1,3,5,7,9-pentahydrogen-1,3,5,7,9-pentamethylcyclosiloxane, and 1,3,5,7,9,11-hexahydrogen-1,3,5,7,9,11-hexamethylcyclosiloxane.

Specifically, for example, the cyclic siloxane in the present invention may suitably be 1,3,5,7-tetrahydrogen-1,3,5,7-tetramethylcyclotetrasiloxane, in terms of the industrial availability, reactivity in modification, the heat resistance, light resistance, and strength of the cured article to be obtained, and the like.

In the present invention, the groups attached to Si atoms are preferably selected from a hydrogen atom, a vinyl group, and a methyl group, in terms of the heat resistance and light resistance.

<Hydrosilylation Catalyst>

In the present invention, a hydrosilylation catalyst is used for synthesis of the modified polyhedral polysiloxane (A) and for curing the polysiloxane composition including the compound (A).

The hydrosilylation catalyst used in the present invention may be any catalyst generally known as a hydrosilylation catalyst, and is not particularly limited.

Specific examples thereof include substances such as platinum-olefin complexes, chloroplatinic acid, elemental platinum, and carriers (such as alumina, silica, and carbon black) which carry solid platinum; platinum-vinylsiloxane complexes such as $Pt_n(ViMe_2SiOSiMe_2Vi)_n$ and $Pt[(MeVi-SiO)_4]_m$; platinum-phosphine complexes such as $Pt(PPh_3)_4$ and $Pt(PBu_3)_4$; platinum-phosphite complexes such as $Pt[P(OPh)_3]_4$ and $Pt[P(OBu)_3]_4$ in which Me represents a methyl group, Bu represents a butyl group, Vi represents a vinyl group, Ph represents a phenyl group, and n and m each represent an integer; and $Pt(acac)_2$. In addition, platinum-hydrocarbon complexes as disclosed in U.S. Pat. No. 3,159,601 and No. 3159662 by Ashby, et al., and platinum alcoholate catalysts as disclosed in U.S. Pat. No. 3,220,972 by Lamoreaux, et al. may also be mentioned.

Examples of catalysts other than platinum compounds include $RhCl(PPh_3)_3$, $RhCl_3$, $Rh/Al_2O_3$, $RuCl_3$, $IrCl_3$, $FeCl_3$, $AlCl_3$, $PdCl_2.2H_2O$, $NiCl_2$, and $TiCl_4$. These catalysts may be used alone, or two or more of these may be used in combination. In terms of catalytic activity, preferred are chloroplatinic acid, platinum-olefin complexes, platinum-vinylsiloxane complexes, $Pt(acac)_2$, and the like.

<(A) Modified Polyhedral Polysiloxane>

The modified polyhedral polysiloxane (A) can be synthesized by a hydrosilylation reaction of an alkenyl group-containing polyhedral polysiloxane compound (a) and a hydrosilyl group-containing compound (b) in the presence of a hydrosilylation catalyst. Here, all alkenyl groups of the polyhedral polysiloxane compound (a) do not have to be reacted and some alkenyl groups may remain unreacted.

The hydrosilyl group-containing compound (b) is preferably added in such an amount that the number of hydrogen atoms directly bonded to Si atoms is 2.5 to 20 per alkenyl group of the polyhedral polysiloxane compound (a). The compound (b) added in a small amount allows gelation to proceed by a crosslinking reaction, which may lead to poor handleability of the modified polyhedral polysiloxane (A). The compound (b) added in too large an amount may adversely affect physical properties of the cured article.

The synthesis of the modified polyhedral polysiloxane (A) is preferably carried out by adding an excessive amount of the hydrosilyl group-containing compound (b) for modification, and then evaporating an unreacted portion of the hydrosilyl group-containing compound (b). Here, it is preferable to remove the unreacted hydrosilyl group-containing compound (b) by heating under reduced pressure.

The amount of the hydrosilylation catalyst used for the synthesis of the modified polyhedral polysiloxane (A) is not particularly limited, and the amount is preferably in the range of $10^{-1}$ to $10^{-10}$ mol per mol of alkenyl groups of the polyhedral polysiloxane (a). The amount is more preferably in the range of $10^{-4}$ to $10^{-8}$ mol. If the amount of the hydrosilylation catalyst is too large, discoloration, decreased light resistance, and foaming of the cured article to be obtained may occur because some hydrosilylation catalysts absorb short-wavelength light. If the amount of the hydrosilylation catalyst is too small, the reaction may not proceed, resulting in no acquisition of the targeted product.

The reaction temperature of the hydrosilylation reaction is preferably 30° C. to 400° C., more preferably 40° C. to 250° C., and further preferably 45° C. to 140° C. At too low a temperature, the reaction may not sufficiently proceed, and at too high a temperature, gelation may occur, leading to deterioration of handleability.

The thus obtained modified polyhedral polysiloxane (A) can have compatibility with various compounds, particularly with siloxane compounds. Moreover, the modified polyhedral polysiloxane (A) can react with various compounds containing an alkenyl group since it contains a hydrosilyl group in a molecule. Specifically, the reaction with the alkenyl group-containing compound (B), which will be described later, can produce a cured article. Here, the modified polyhedral polysiloxane (A) preferably contains at least three hydrosilyl groups in a molecule. With less than three hydrosilyl groups, the strength of the resulting cured article may not be sufficient.

Also, the modified polyhedral polysiloxane (A) in the present invention may be provided in a liquid form at 20° C. Such a liquid, modified polyhedral polysiloxane (A) can be obtained, for example, by modifying the polyhedral polysiloxane compound (a) with a hydrosilyl group-containing cyclic siloxane or straight-chain polysiloxane. The liquid, modified polyhedral polysiloxane (A) is preferred because of its excellent handleability.

In terms of the heat resistance, light resistance, or the strength of the cured article to be obtained, preferred examples of the modified polyhedral polysiloxane (A) in the present invention include those containing a structural unit represented by the following formula:

wherein a+b is an integer of 6 to 24, provided that a represents an integer of 1 or more, and b represents an integer of 0 or 1 or more; $R^3$ represents an alkyl or aryl group; $R^4$ represents an alkenyl group, a hydrogen atom, an alkyl group, an aryl group, or a group bonded to another polyhedral polysiloxane; and X has a structure represented by the following formula (1) or (2), and in the case where multiple Xs are present, the structures of the Xs may be the same as or different from one another:

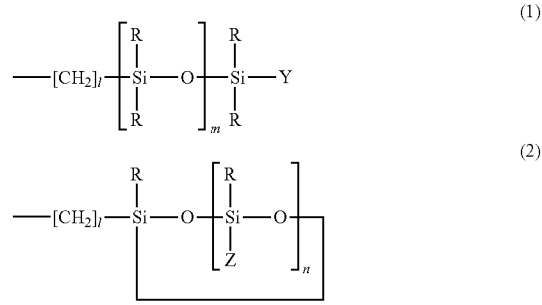

wherein l represents an integer of 2 or more; m represents an integer of 0 or more; n represents an integer of 2 or more; Y represents a hydrogen atom, an alkenyl group, an alkyl group, an aryl group, or a moiety bonded to a polyhedral polysiloxane via an alkylene chain, and Ys may be the same as or different from one another; and Z represents a hydrogen atom, an alkenyl group, an alkyl group, an aryl group, or a moiety bonded to a polyhedral polysiloxane via an alkylene chain, and Zs may be the same as or different from one another, provided that at least one of Y and Z is a hydrogen atom.

<(B) Organopolysiloxane that Contains at Least Two Alkenyl Groups in a Molecule>

The component (B) in the present invention preferably contains at least two alkenyl groups, more preferably two to ten alkenyl groups, in a molecule. A component (B) containing more alkenyl groups in a molecule leads to more crosslinks, resulting in enhanced gas-barrier properties of the cured article formed from the polysiloxane composition of the present invention. However, a component (B) containing too many alkenyl groups may lead to deteriorated heat and light resistance.

The number of siloxane units in the component (B) in the present invention is not particularly limited, and is preferably at least two, and more preferably two to ten. A component (B) containing less siloxane units in a molecule tends to volatilize from the polysiloxane composition system, and therefore desired physical properties may not be given. Conversely, a component (B) containing more siloxane units may cause the resulting cured article to have low gas-barrier properties such as high water vapor transmission rate.

Preferred examples of the organopolysiloxane (B) that contains at least two alkenyl groups in a molecule, which is the component (B) in the present invention, include polysiloxanes containing alkenyl groups, such as straight-chain polysiloxanes containing at least two alkenyl groups, polysiloxanes terminated with at least two alkenyl groups, and cyclic siloxanes containing at least two alkenyl groups, in terms of the heat resistance and light resistance. Each of these alkenyl group-containing compounds may be used alone, or two or more of these may be used in combination.

Specific examples of the straight-chain polysiloxanes containing at least two alkenyl groups include copolymers containing dimethylsiloxane units, methylvinylsiloxane units, and terminal trimethylsiloxy units; copolymers containing diphenylsiloxane units, methylvinylsiloxane units, and terminal trimethylsiloxy units; copolymers containing methylphenylsiloxane units, methylvinylsiloxane units, and terminal trimethylsiloxy units; dimethylvinylsilyl group-terminated polydimethylsiloxanes; dimethylvinylsilyl group-terminated polydiphenylsiloxanes; dimethylvinylsilyl group-terminated polymethylphenylsiloxanes; copolymers containing dimethylsiloxane units, methylvinylsiloxane units, and terminal triethylsiloxy units; copolymers containing diphenylsiloxane units, methylvinylsiloxane units, and terminal triethylsiloxy units; and copolymers containing methylphenylsiloxane units, methylvinylsiloxane units, and terminal triethylsiloxy units. In particular, in terms of the heat and light resistance, preferred examples include copolymers containing dimethylsiloxane units, methylvinylsiloxane units, and terminal trimethylsiloxy units; copolymers containing diphenylsiloxane units, methylvinylsiloxane units, and terminal trimethylsiloxy units; copolymers containing methylphenylsiloxane units, methylvinylsiloxane units, and terminal trimethylsiloxy units; dimethylvinylsilyl group-terminated polydimethylsiloxanes; dimethylvinylsilyl group-terminated polydiphenylsiloxanes; and dimethylvinylsilyl group-terminated polymethylphenylsiloxanes.

Specific examples of the polysiloxanes terminated with at least two alkenyl groups include dimethylalkenyl group-terminated polysiloxanes mentioned above; polysiloxanes containing a dimethylalkenylsiloxane unit and at least one siloxane unit selected from the group consisting of $SiO_2$ unit, $SiO_{3/2}$ unit, and SiO unit; diethylalkenyl group-terminated polysiloxanes; and polysiloxanes containing a diethylalkenylsiloxane unit and at least one siloxane unit selected from the group consisting of $SiO_2$ unit, $SiO_{3/2}$ unit, and SiO unit. In particular, in terms of the heat and light resistance, preferred examples include dimethylalkenyl group-terminated polysiloxanes, and polysiloxanes containing a dimethylalkenylsiloxane unit and at least one siloxane unit selected from the group consisting of $SiO_2$ unit, $SiO_{3/2}$ unit, and SiO unit.

Examples of the cyclic siloxane compounds containing at least two alkenyl groups include 1,3,5,7-tetravinyl-1,3,5,7-tetramethylcyclotetrasiloxane, 1,3,5,7-tetravinyl-1-phenyl-3,5,7-trimethylcyclotetrasiloxane, 1,3,5,7-tetravinyl-1,3-diphenyl-5,7-dimethylcyclotetrasiloxane, 1,3,5,7-tetravinyl-1,5-diphenyl-3,7-dimethylcyclotetrasiloxane, 1,3,5,7-tetravinyl-1,3,5-triphenyl-7-methylcyclotetrasiloxane, 1-phenyl-3,5,7-trivinyl-1,3,5,7-tetramethylcyclotetrasiloxane, 1,3-diphenyl-5,7-divinyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, 1,3,5,7,9,11-hexavinyl-1,3,5,7,9,11-hexamethylcyclosiloxane, 1-propyl-3,5,7-trivinyl-1,3,5,7-tetramethylcyclotetrasiloxane, and 1,5-divinyl-3,7-dihexyl-1,3,5,7-tetramethylcyclotetrasiloxane. In particular, in terms of the heat and light resistance, preferred examples include 1,3,5,7-tetravinyl-1,3,5,7-tetramethylcyclotetrasiloxane, 1,3,5,7-tetravinyl-1-phenyl-3,5,7-trimethylcyclotetrasiloxane, 1,3,5,7-tetravinyl-1,3-diphenyl-5,7-dimethylcyclotetrasiloxane, 1,3,5,7-tetravinyl-1,5-diphenyl-3,7-dimethylcyclotetrasiloxane, 1,3,5,7-tetravinyl-1,3,5-triphenyl-7-methylcyclotetrasiloxane, 1-phenyl-3,5,7-trivinyl-1,3,5,7-tetramethylcyclotetrasiloxane, 1,3-diphenyl-5,7-divinyl-1,3,5,7-tetramethylcyclotetrasiloxane, 1,3,5-trivinyl-1,3,5-trimethylcyclosiloxane, 1,3,5,7,9-pentavinyl-1,3,5,7,9-pentamethylcyclosiloxane, and 1,3,5,7,9,11-hexavinyl-1,3,5,7,9,11-hexamethylcyclosiloxane. Each of these may be used alone, or two or more of these may be used in combination.

The amount of the component (B), namely, the organopolysiloxane that contains at least two alkenyl groups in a molecule, can vary and the preferred amount is such that the number of hydrogen atoms directly bonded to Si atoms in the component (A), namely, the modified polyhedral polysiloxane, is 0.3 to 5, preferably 0.5 to 3, per alkenyl group. Too low a ratio of alkenyl groups tends to lead to poor appearance because of foaming and the like. Too high a ratio thereof may cause adverse effects on physical properties of the cured article.

The polysiloxane composition of the present invention includes the modified polyhedral polysiloxane (component (A)) and the organopolysiloxane (component (B)), and also has a feature that the polysiloxane composition includes:

(B1) an aryl group-containing organopolysiloxane as the organopolysiloxane (B), and/or (C) a component which is (C1) an organosilicon compound that contains one alkenyl or hydrosilyl group in a molecule, or (C2) a cyclic olefin compound that contains one carbon-carbon double bond in a molecule.

Since the polysiloxane composition has such features, the cured article formed from the polysiloxane composition has heat and weather resistance, and moreover, excellent gas-barrier properties.

<(B1) Aryl Group-Containing Organopolysiloxane>

When the component (B) in the present invention is an aryl group-containing organopolysiloxane (B1) which contains alkenyl groups, the aryl group-containing organopolysiloxane (B1) may contain at least one aryl group in a molecule, and the aryl group may be located either in a side chain or at an end of the molecule.

Examples of the aryl group include phenyl, naphthyl, 2-methylphenyl, 3-methylphenyl, 4-methylphenyl, 2-ethylphenyl, 3-ethylphenyl, 4-ethylphenyl, 2-propylphenyl, 3-propylphenyl, 4-propylphenyl, 3-isopropylphenyl, 4-isopropylphenyl, 2-butylphenyl, 3-butylphenyl, 4-butylphenyl, 3-isobutylphenyl, 4-isobutylphenyl, 3-t-butylphenyl, 4-t-butylphenyl, 3-pentylphenyl, 4-pentylphenyl, 3-hexylphenyl, 4-hexylphenyl, 3-cyclohexylphenyl, 4-cyclohexylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2,3-diethylphenyl, 2,4-diethylphenyl, 2,5-diethylphenyl, 2,6-diethylphenyl, 3,4-diethylphenyl, 3,5-diethylphenyl, cyclohexylphenyl, biphenyl, 2,3,4-trimethylphenyl, 2,3,5-trimethylphenyl, 2,4,5-trimethylphenyl, 3-epoxyphenyl, 4-epoxyphenyl, 3-glycidylphenyl, and 4-glycidylphenyl groups. In particular, in terms of the heat and light resistance, preferred examples include a phenyl group. Each of these may be used alone, or two or more of these may be used in combination.

The aryl group-containing organopolysiloxane (B1) preferably has a weight-average molecular weight of not more than 3500, more preferably of 150 to 2000, and further preferably of 200 to 1000. The component (B1) with a small weight-average molecular weight tends to volatilize from the polysiloxane composition system, and therefore desired physical properties may not be given. The component (B1) with a large weight-average molecular weight may cause the resulting cured article to have low gas-barrier properties such as high water vapor transmission rate.

The amount of aryl groups in the component (B1) preferably ranges from 0.1 to 10 mmol/g, and more preferably from 1 to 10 mmol/g. The molar ratio of aryl groups to substituted or unsubstituted univalent hydrocarbon groups other than the aryl group (mole of aryl groups/mole of substituted or unsubstituted univalent hydrocarbon groups other than the aryl group) preferably ranges from 0.01 to 30. The more the amount of aryl groups is, the more the gas-barrier properties of the cured article are enhanced, and the more the adhesion strength to aromatic substrates is enhanced.

The polysiloxane composition of the present invention may contain, as the component (C), (C1) an organosilicon compound that contains one alkenyl or hydrosilyl group in a molecule, or (C2) a cyclic olefin compound that contains one carbon-carbon double bond in a molecule.

<(C1) Organosilicon Compound that Contains One Alkenyl or Hydrosilyl Group in Molecule>

When the component (C1) contains an alkenyl group in a molecule, the component reacts with the hydrosilyl group of the component (A). On the other hand, when the component (C1) contains a hydrosilyl group in a molecule, the component reacts with the alkenyl group of the component (B). The use of the component (C1) in the present invention allows reduction in the elastic modulus of the cured article and enhancement in properties such as gas-barrier properties and crack resistance including hot and cold impact resistance.

The component (C1) in the present invention preferably contains at least one aryl group in a molecule, in terms of the gas-barrier properties, refractive index, and the like. More preferably, the aryl group is directly bonded to a silicon atom, in terms of the heat and light resistance. The larger the number of aryl groups in a molecule of such a component (C1) is, the larger the effects of enhancing the gas-barrier properties and refractive index of the cured article are.

The component (C1) in the present invention may preferably be a silane or polysiloxane in terms of the heat and light resistance. In the case that the component (C1) is a silane containing one alkenyl group in a molecule, specific examples of the component (C1) include vinyltrimethylsilane, vinyldimethylphenylsilane, vinyldiphenylmethylsilane, vinyltriphenylsilane, vinyltriethylsilane, vinyldiethylphenylsilane, vinyldiphenylethylsilane, allyldimethylphenylsilane, allyldiphenylmethylsilane, allyltriphenylsilane, allyldiethylphenylsilane, and allyldiphenylethylsilane. In particular, in terms of the heat and light resistance, preferred examples include vinyltrimethylsilane, vinyldimethylphenylsilane, vinyldiphenylmethylsilane, and vinyltriphenylsilane. In the case that the component (C1) is a silane containing one hydrosilyl group in a molecule, specific examples of the component (C1) include trimethylsilane, dimethylphenylsilane, diphenylmethylsilane, triphenylsilane, triethylsilane, diethylphenylsilane, and diphenylethylsilane. In particular, in terms of the heat and light resistance, preferred examples include trimethylsilane, dimethylphenylsilane, diphenylmethylsilane, and triphenylsilane.

In the case that the component (C1) is a polysiloxane, examples of the component (C1) include straight-chain polysiloxanes containing one alkenyl or hydrosilyl group, polysiloxanes terminated with one alkenyl or hydrosilyl group, and cyclic siloxanes containing one alkenyl or hydrosilyl group.

In the case that the component (C1) is a straight-chain polysiloxane containing one alkenyl group in a molecule, specific examples of the component (C1) include polydimethylsiloxanes whose ends are terminated with one dimethylvinylsilyl group and one trimethylsilyl group, respectively; polymethylphenylsiloxanes whose ends are terminated with one dimethylvinylsilyl group and one trimethylsilyl group, respectively; polydiphenylsiloxanes whose ends are terminated with one dimethylvinylsilyl group and one trimethylsilyl group, respectively; copolymers containing dimethylsiloxane units and methylphenylsiloxane units, whose ends are terminated with one dimethylvinylsilyl group and one trimethylsilyl group, respectively; copolymers containing dimethylsiloxane units and diphenylsiloxane units, whose ends are terminated with one dimethylvinylsilyl group and one trimethylsilyl group, respectively; polydimethylsiloxanes whose ends are terminated with one diethylvinylsilyl group and one triethylsilyl group, respectively; polymethylphenylsiloxanes whose ends are terminated with one diethylvinylsilyl group and one triethylsilyl group, respectively; polydiphenylsiloxanes whose ends are terminated with one diethylvinylsilyl group and one triethylsilyl group, respectively; copolymers containing dimethylsiloxane units and methylphenylsiloxane units, whose ends are terminated with one diethylvinylsilyl group and one triethylsilyl group, respectively; and copolymers containing dimethylsiloxane units and diphenylsiloxane units, whose ends are terminated with one diethylvinylsilyl group and one triethylsilyl group, respectively. In particular, in terms of the heat and light resistance, preferred examples include polydimethylsiloxanes whose ends are terminated with one dimethylvinylsilyl group and one trimethylsilyl group, respectively; polymethylphenylsiloxanes whose ends are terminated with one dimethylvinylsilyl group and one trimethylsilyl group, respectively; polydiphenylsiloxanes whose ends are terminated with one dimethylvinylsilyl group and one trimethylsilyl group, respectively; copolymers containing dimethylsiloxane units and methylphenylsiloxane units, whose ends are terminated with one dimethylvinylsilyl group and one trimethylsilyl group, respectively; and copolymers containing dimethylsiloxane units and diphenylsiloxane units, whose ends are terminated with one dimethylvinylsilyl group and one trimethylsilyl group, respectively.

In the case that the component (C1) is a straight-chain polysiloxane containing one hydrosilyl group in a molecule, specific examples of the component (C1) include polydimethylsiloxanes whose ends are terminated with one dimethylhydrogensilyl group and one trimethylsilyl group, respectively; polymethylphenylsiloxanes whose ends are terminated with one dimethylhydrogensilyl group and one trimethylsilyl group, respectively; polydiphenylsiloxanes whose ends are terminated with one dimethylhydrogensilyl group and one trimethylsilyl group, respectively; copolymers containing dimethylsiloxane units and methylphenylsiloxane units, whose ends are terminated with one dimethylhydrogensilyl group and one trimethylsilyl group, respectively; copolymers containing dimethylsiloxane units and diphenylsiloxane units, whose ends are terminated with one dimethylhydrogensilyl group and one trimethylsilyl group, respectively; polydimethylsiloxanes whose ends are terminated with one diethylhydrogensilyl group and one triethylsilyl group, respectively; polymethylphenylsiloxanes whose ends are terminated with one diethylhydrogensilyl group and one triethylsilyl group, respectively; polydiphenylsiloxanes whose ends are terminated with one diethylhydrogensilyl group and one triethylsilyl group, respectively; copolymers containing dimethylsiloxane units and methylphenylsiloxane units, whose ends are terminated with one diethylhydrogensilyl group and one triethylsilyl group, respectively; and copolymers containing dimethylsiloxane units and diphenylsiloxane units, whose ends are terminated with one diethylhydrogensilyl group and one triethylsilyl group, respectively. In particular, in terms of the heat and light resistance, preferred examples include polydimethylsiloxanes whose ends are terminated with one dimethylhydrogensilyl group and one trimethylsilyl group, respectively; polymethylphenylsiloxanes whose ends are terminated with one dimethylhydrogensilyl group and one trimethylsilyl group, respectively; polydiphenylsiloxanes whose ends are terminated with one dimethylhydrogensilyl group and one trimethylsilyl group, respectively; copolymers containing dimethylsiloxane units and methylphenylsiloxane units, whose ends are terminated with one dimethylhydrogensilyl group and one trimethylsilyl group, respectively; and copolymers containing dimethylsiloxane units and diphenylsiloxane units, whose ends are terminated with one dimethylhydrogensilyl group and one trimethylsilyl group, respectively.

In the case that the component (C1) is a polysiloxane terminated with one alkenyl group, specific examples of the component (C1) include polysiloxanes each of which is terminated at an end by one dimethylvinylsilyl group, and contains at least one siloxane unit selected from the group consisting of $SiO_2$ unit, $SiO_{3/2}$ unit, and SiO unit; and polysiloxanes each of which is terminated at an end by one diethylvinylsilyl group, and contains at least one siloxane unit selected from the group consisting of $SiO_2$ unit, $SiO_{3/2}$ unit, and SiO unit. In particular, in terms of the heat and light resistance, preferred examples include polysiloxanes each of which is terminated at an end by one dimethylvinylsilyl group, and contains at least one siloxane unit selected from the group consisting of $SiO_2$ unit, $SiO_{3/2}$ unit, and SiO unit.

In the case that the component (C1) is a polysiloxane terminated with one hydrosilyl group, specific examples of the component (C1) include polysiloxanes each of which is terminated at an end by one dimethylhydrogensilyl group, and contains at least one siloxane unit selected from the group consisting of $SiO_2$ unit, $SiO_{3/2}$ unit, and SiO unit; and polysiloxanes each of which is terminated at an end by one dimethylhydrogensilyl group, and contains at least one siloxane unit selected from the group consisting of $SiO_2$ unit, $SiO_{3/2}$ unit, and SiO unit. In particular, in terms of the heat and light resistance, preferred examples include polysiloxanes each of which is terminated at an end by one dimethylhydrogensilyl group, and contains at least one siloxane unit selected from the group consisting of $SiO_2$ unit, $SiO_{3/2}$ unit, and SiO unit.

In the case that the component (C1) is a cyclic siloxane containing one alkenyl group, specific examples of the component (C1) include 1-vinyl-1,3,3,5,5,7,7-heptamethylcyclotetrasiloxane, 1-vinyl-3-phenyl-1,3,5,5,7,7-hexamethylcyclotetrasiloxane, 1-vinyl-3,5-diphenyl-1,3,5,7,7-pentamethylcyclotetrasiloxane, 1-vinyl-3,5,7-triphenyl-1,3,5,7-tetramethylcyclotetrasiloxane, 1-vinyl-1,3,3,5,5,7,7-heptaethylcyclotetrasiloxane, 1-vinyl-3-phenyl-1,3,5,5,7,7-hexaethylcyclotetrasiloxane, 1-vinyl-3,5-diphenyl-1,3,5,7,7-pentaethylcyclotetrasiloxane, and 1-vinyl-3,5,7-triphenyl-1,3,5,7-tetraethylcyclotetrasiloxane. In particular, in terms of the heat and light resistance, preferred examples include 1-vinyl-1,3,3,5,5,7,7-heptamethylcyclotetrasiloxane, 1-vinyl-3-phenyl-1,3,5,5,7,7-hexamethylcyclotetrasiloxane, 1-vinyl-3,5-diphenyl-1,3,5,7,7-pentamethylcyclotetrasiloxane, and 1-vinyl-3,5,7-triphenyl-1,3,5,7-tetramethylcyclotetrasiloxane.

In the case that the component (C1) is a cyclic siloxane containing one hydrosilyl group, specific examples of the component (C1) include 1-hydrogen-1,3,3,5,5,7,7-heptamethylcyclotetrasiloxane, 1-hydrogen-3-phenyl-1,3,5,5,7,7-hexamethylcyclotetrasiloxane, 1-hydrogen-3,5-diphenyl-1,3,5,7,7-pentamethylcyclotetrasiloxane, 1-hydrogen-3,5,7-triphenyl-1,3,5,7-tetramethylcyclotetrasiloxane, 1-hydrogen-1,3,3,5,5,7,7-heptaethylcyclotetrasiloxane, 1-hydrogen-3-phenyl-1,3,5,5,7,7-hexamethylcyclotetrasiloxane, 1-hydrogen-3,5-diphenyl-1,3,5,7,7-pentaethylcyclotetrasiloxane, and 1-hydrogen-3,5,7-triphenyl-1,3,5,7-tetraethylcyclotetrasiloxane. In particular, in terms of the heat and light resistance, preferred examples include 1-hydrogen-1,3,3,5,5,7,7-heptamethylcyclotetrasiloxane, 1-hydrogen-3-phenyl-1,3,5,5,7,7-hexamethylcyclotetrasiloxane, 1-hydrogen-3,5-diphenyl-1,3,5,7,7-pentamethylcyclotetrasiloxane, and 1-hydrogen-3,5,7-triphenyl-1,3,5,7-tetramethylcyclotetrasiloxane.

The amount of the component (C1) can vary, and the component (C1) is preferably used in an amount of 1 to 60 wt %, and more preferably 5 to 50 wt %, of the total amount (100 wt %) of the component (C1), the component (A), and the component (B). If the amount of the component (C1) is too large, the resulting cured article may become too soft, thereby leading to defect in performance. If the amount thereof is too small, the crosslink density of the composition may become too high, which may cause cracks.

Each of these organosilicon compounds containing one alkenyl or hydrosilyl group in a molecule as the component (C1) may be used alone, or two or more of them may be used in combination.

<(C2) Cyclic Olefin Compound that Contains One Carbon-Carbon Double Bond in a Molecule>

The cyclic olefin compound (C2) that contains one carbon-carbon double bond in a molecule in the present invention reacts with the hydrosilyl group of the component (A). The use of the component (C2) allows reduction in the elastic modulus of the cured article and enhancement in properties such as breaking strength, gas-barrier properties, and crack resistance including hot and cold impact resistance.

The component (C2) in the present invention may be any cyclic olefin compound as long as it contains one carbon-carbon double bond in a molecule. The carbon-carbon double bond may be any of vinylene, vinylidene, and alkenyl groups. Examples of the alkenyl groups include vinyl, allyl, butenyl, and hexenyl groups, and a vinyl group is preferred in terms of the heat and light resistance.

The component (C2) in the present invention preferably has an average molecular weight of not larger than 1000.

In terms of the reactivity with the component (b), more preferred examples of the component (C2) include cyclic olefin compounds represented by the following formula:

$$C_nH_{2(n-x)}$$

wherein n represents an integer of 4 to 20, and x represents an integer of 1 to 5, provided that n–x is an integer of 3 or more.

Examples of these cyclic olefin compounds include aliphatic cyclic olefin compounds and substituted aliphatic cyclic olefin compounds.

Specific examples of the aliphatic cyclic olefin compounds include cyclohexene, cycloheptene, cyclooctene, vinylcyclohexane, vinylcycloheptane, vinylcyclooctane, allylcyclohexane, allylcycloheptane, allylcyclooctane, and methylenecyclohexane.

Specific examples of the substituted aliphatic cyclic olefin compounds include norbornene, 1-methylnorbornene, 2-methylnorbornene, 7-methylnorbornene, 2-vinylnorbornane, 7-vinylnorbornane, 2-allylnorbornane, 7-allylnorbornane, 2-methylenenorbornane, 7-methylenenorbornane, camphene, vinylcamphene, 6-methyl-5-vinyl-bicyclo[2.2.1]-heptane, 3-methyl-2-methylene-bicyclo[2.2.1]-heptane, α-pinene, β-pinene, 6,6-dimethyl-bicyclo[3.1.1]-2-heptaene, longifolene, 2-vinyladamantane, and 2-methyleneadamantane.

In particular, in terms of the availability, preferred examples include cyclohexene, vinylcyclohexane, norbornene, camphene, and pinenes.

Each of these cyclic olefin compounds (C2) containing one carbon-carbon double bond in a molecule may be used alone, or two or more of them may be used in combination.

The amount of the cyclic olefin compound (C2) that contains one carbon-carbon double bond in a molecule is preferably such that the number of carbon-carbon double bonds of the component (C2) is 0.01 to 0.5 per hydrosilyl group of the hydrosilyl group-containing compound (b) mentioned above. If the amount of the component (C2) is too small, the cured article to be obtained may have reduced hot and cold impact resistance, and if the amount thereof is too large, a cured article that is not sufficiently cured may be obtained.

<Curing Catalyst>

In the present invention, a hydrosilylation catalyst is used for curing the polysiloxane composition. The hydrosilylation catalyst used in the present invention may be a generally known hydrosilylation catalyst, and is not particularly limited.

Specific examples of the hydrosilylation catalyst are as described above and are the same as those for the hydrosilylation catalyst used for the synthesis of the modified polyhedral polysiloxane (A).

<Curing Retardant>

The curing retardant is an optional component that is used in order to improve the storage stability of the polysiloxane composition of the present invention or to control the reactivity of the hydrosilylation reaction in the curing process. The curing retardant used in the present invention may be any one generally known to be used for addition-curable compositions using a hydrosilylation catalyst, and specific examples thereof include compounds containing an aliphatic unsaturated bond, organophosphorus compounds, organosulfur compounds, nitrogen-containing compounds, tin compounds, and organic peroxides. Each of these may be used alone, or two or more of these may be used in combination.

Specific examples of the compounds containing an aliphatic unsaturated bond include propargyl alcohols such as 3-hydroxy-3-methyl-1-butyne, 3-hydroxy-3-phenyl-1-butyne, 3,5-dimethyl-1-hexyne-3-ol, and 1-ethynyl-1-cyclohexanol; ene-yne compounds; and maleates such as maleic anhydride and dimethyl maleate.

Specific examples of the organophosphorus compounds include triorganophosphines, diorganophosphines, organophosphones, and triorganophosphites.

Specific examples of the organosulfur compounds include organomercaptans, diorganosulfides, hydrogen sulfide, benzothiazole, thiazole, and benzothiazole disulfide.

Specific examples of the nitrogen-containing compounds include N,N,N',N'-tetramethylethylenediamine, N,N-dimethylethylenediamine, N,N-diethylethylenediamine, N,N-dibutylethylenediamine, N,N-dibutyl-1,3-propanediamine, N,N-dimethyl-1,3-propanediamine, N,N,N',N'-tetraethylethylenediamine, N,N-dibutyl-1,4-butanediamine, and 2,2'-bipyridine.

Specific examples of the tin compounds include stannous halide dihydrates and stannous carboxylate.

Specific examples of the organic peroxides include di-t-butyl peroxide, dicumyl peroxide, benzoyl peroxide, and t-butyl perbenzoate. Among these, dimethyl maleate, 3,5-dimethyl-1-hexyne-3-ol, and 1-ethynyl-1-cyclohexanol may be mentioned as particularly preferred curing retardants.

The amount of the curing retardant is not particularly limited, and it preferably ranges from $10^{-1}$ to $10^3$ mol, more preferably from 1 to 100 mol, per mol of the hydrosilylation catalyst. Each of these curing retardants may be used alone, or two or more of these may be used in combination.

<Adhesion Promoter>

The adhesion promoter is an optional component that is used in order to enhance adhesion between the polysiloxane composition of the present invention and a substrate. There is no limitation in selecting the adhesion promoter as long as it exerts such an effect, and preferred examples thereof include silane coupling agents.

The silane coupling agents are not particularly limited as long as they are compounds each of which contains at least one functional group reactive with an organic group, and at least one hydrolyzable silicon group in a molecule. The functional group reactive with an organic group is preferably at least one functional group selected from the group consisting of epoxy, methacrylic, acrylic, isocyanate, isocyanurate, vinyl, and carbamate groups, in terms of the handleability. In terms of the curability and adhesion, epoxy, methacrylic, and acrylic groups are more preferred. As for the hydrolyzable silicon group, alkoxysilyl groups are preferred in terms of the handleability, and methoxysilyl and ethoxysilyl groups are more preferred in terms of the reactivity.

Specific preferred examples of the silane coupling agents include alkoxysilanes containing an epoxy functional group, such as 3-glycidoxypropyltrimethoxysilane, 3-glycidoxypropylmethyldimethoxysilane, 3-glycidoxypropyltriethoxysilane, 3-glycidoxypropylmethyldiethoxysilane, 2-(3,4-epoxycyclohexyl)ethyltrimethoxysilane, 2-(3,4-epoxycyclohexyl)ethylmethyldimethoxysilane, 2-(3,4-epoxycyclohexyl)ethyltriethoxysilane, and 2-(3,4-epoxycyclohexyl)ethylmethyldiethoxysilane; and alkoxysilanes containing a methacrylic or acrylic group, such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane. Each of these may be used alone, and two or more of these may be used in combination.

The amount of the silane coupling agent is preferably 0.05 to 30 parts by weight, and more preferably 0.1 to 10 parts by weight, for each 100 parts by weight of a mixture of the components (A) and (B). A silane coupling agent in a small amount may not have an effect in improving adhesion. A silane coupling agent in a large amount may adversely affect the physical properties of the cured article.

In the present invention, a known adhesion enhancer may be used in order to enhance the effect of the adhesion promoter. Examples of the adhesion enhancer include, but are not limited to, epoxy-containing compounds, epoxy resins, boronic acid ester compounds, organoaluminum compounds, and organotitanium compounds.

<Inorganic Filler>

The polysiloxane composition of the present invention may optionally contain an inorganic filler.

The use of an inorganic filler as a component of the polysiloxane composition of the present invention can improve the physical properties of a molded product to be obtained, in terms of the strength, hardness, elastic modulus, coefficient of thermal expansion, thermal conductivity, heat dissipation, electrical characteristics, light reflectance, flame retardance, fire resistance, gas-barrier properties, and the like.

The inorganic filler is not particularly limited as long as it is an inorganic material or a compound that contains an inorganic material, and specific examples thereof include silica-based inorganic fillers (e.g. quartz, fumed silica, precipitated silica, silicic anhydride, molten silica, crystalline silica, and ultrafine amorphous silica), alumina, zircon, iron oxide, zinc oxide, titanium oxide, silicon nitride, boron nitride, aluminum nitride, silicon carbide, glass fiber, glass flakes, alumina fiber, carbon fiber, mica, black lead, carbon black, ferrite, graphite, diatomaceous earth, white clay, clay, talc, aluminum hydroxide, calcium carbonate, manganese carbonate, magnesium carbonate, barium sulfate, potassium titanate, calcium silicate, inorganic balloons, and silver powder. Each of these may be used alone, and two or more of these may be used in combination.

The inorganic filler may appropriately be surface-treated. Examples of the surface treatment include, but not limited to, alkylation treatment, trimethylsilylation treatment, silicone treatment, and treatment by a coupling agent.

Examples of the coupling agent include silane coupling agents. The silane coupling agents are not particularly limited as long as they are compounds each of which contains at least one functional group reactive with an organic group, and at least one hydrolyzable silicon group in a molecule. The functional group reactive with an organic group is preferably at least one functional group selected from the group consisting of epoxy, methacrylic, acrylic, isocyanate, isocyanurate, vinyl, and carbamate groups, in terms of the handleability. In terms of the curability and adhesion, epoxy, methacrylic, and acrylic groups are particularly preferred. As for the hydrolyzable silicon group, alkoxysilyl groups are preferred in terms of the handleability, and methoxysilyl and ethoxysilyl groups are particularly preferred in terms of the reactivity.

Preferred examples of the silane coupling agents include alkoxysilanes containing an epoxy functional group, such as 3-glycidoxypropyltrimethoxysilane, 3-glycidoxypropyltriethoxysilane, 2-(3,4-epoxycyclohexyl)ethyltrimethoxysilane, and 2-(3,4-epoxycyclohexyl)ethyltriethoxysilane; and alkoxysilanes containing a methacrylic or acrylic group, such as 3-methacryloxypropyltrimethoxysilane, 3-methacryloxypropyltriethoxysilane, 3-acryloxypropyltrimethoxysilane, 3-acryloxypropyltriethoxysilane, methacryloxymethyltrimethoxysilane, methacryloxymethyltriethoxysilane, acryloxymethyltrimethoxysilane, and acryloxymethyltriethoxysilane.

Inorganic fillers having various shapes such as crushed, flake, spherical, and rod shapes, may be used. The average particle size and particle size distribution of the inorganic filler are not particularly limited, and the preferred average particle size ranges from 0.005 to 100 μm, more preferably from 0.01 to 50 μm.

The BET specific surface area thereof is not particularly limited either, and the preferred BET specific surface area is not less than 70 $m^2/g$, more preferably not less than 100 $m^2/g$, and particularly preferably not less than 200 $m^2/g$, in terms of the gas-barrier properties.

Here, the BET specific surface area refers to the specific surface area of particles determined by a gas adsorption method. The determination of the specific surface area of particles by a gas adsorption method is carried out by adsorbing gas molecules with a known adsorption area, such as nitrogen gas, onto the particles, and then calculating the specific surface area of the particles from the adsorbed amount of the gas molecules. In the determination of the BET specific surface area, the amount of gas molecules directly adsorbed on a solid surface (monolayer adsorption amount) can be accurately determined. The BET specific surface area can be calculated according to an equation called BET equation which is shown below.

The BET equation represents the relationship between the adsorption equilibrium pressure P in an adsorption equilibrium state at a constant temperature and the amount of adsorption V at the pressure, as shown in the following equation (1):

$$P/V(Po-P)=(1/VmC)+((C-1)/VmC)(P/Po) \qquad \text{Equation (1)}$$

(Po: saturated vapor pressure, Vm: monolayer adsorption amount, or the amount of adsorption of gas molecules forming a monolayer on a solid surface, C: parameter related to heat of adsorption and the like (>0)).

The surface area of particles can be determined by calculating the monolayer adsorption amount (Vm) using the equation, and then multiplying the obtained amount by the cross-sectional area of one gas molecule.

The amount of the inorganic filler is not particularly limited, and it preferably ranges from 1 to 1000 parts by weight, more preferably from 5 to 500 parts by weight, and further preferably from 10 to 300 parts by weight, for each 100 parts by weight of a mixture of the components (A), (B), and (C). An inorganic filler in too large an amount may deteriorate the fluidity, and an inorganic filler in a small amount may lead to production of a molded product with insufficient physical properties.

The order of mixing of the inorganic filler is not particularly limited, and a preferred order in terms of better storage stability is mixing the inorganic filler with the component (B), followed by mixing the resulting mixture with the components (A) and (C). Another preferred order is mixing the inorganic filler with a mixture of the components (A), (B), and (C) because the reaction components, namely, the components (A), (B), and (C) are well mixed so that stable molded products tend to be obtained.

The means for mixing the inorganic filler is not particularly limited, and specific examples thereof include stirring apparatus such as two-roll or three-roll mills, planetary stirring and defoaming apparatus, homogenizers, dissolvers, and planetary mixers, and melt-kneaders such as plastomill. The inorganic filler may be mixed at ordinary temperature or under heated conditions, and may be mixed at ordinary pressure or under vacuum conditions. If the inorganic filler is mixed at elevated temperatures, the composition may be cured before molding.

<Polysiloxane Composition and Cured Article>

The polysiloxane composition of the present invention can be prepared by adding the predetermined components (B) and (C), and optionally a hydrosilylation catalyst, a curing retardant, and an adhesion promoter, to the component (A). The polysiloxane composition of the present invention can be handled as a liquid resin composition. The composition in a liquid form can be poured into molds, packages, substrates, and the like, and then heated to cure, whereby molded products can be easily obtained.

As well as having excellent heat resistance, weather resistance and gas-barrier properties, the cured article formed from the polysiloxane composition of the present invention has high hardness, a low coefficient of thermal expansion, and excellent thermal dimensional stability.

If the composition is heated during curing, the temperature is preferably set to 30° C. to 400° C., and more preferably to 50° C. to 250° C. Too high a curing temperature tends to cause poor appearance on the resulting cured article, and too low a curing temperature leads to insufficient curing. Also, curing may be performed with a combination of two or more temperature conditions. A specific example thereof is stepwise raising the curing temperature, for example, to 70° C., then to 120° C., and then to 150° C., which is preferred because satisfactory cured articles can be produced.

In the present invention, a hydrosilylation catalyst may be additionally used when needed.

The curing time can be appropriately selected according to the curing temperature, the amount of the hydrosilylation catalyst used, and the amount of hydrosilyl groups used, as well as the combination of other components used in the present composition. By way of example only, a curing time of 1 minute to 12 hours, preferably of 10 minutes to 8 hours, leads to production of satisfactory cured articles.

The polysiloxane composition of the present invention can be used, specifically, for example, by pouring into or applying to a package, substrate, or the like. After being poured or applied, the polysiloxane composition is cured under the above-mentioned curing conditions, whereby molded products (cured articles) can be easily obtained according to the particular applications.

Also, the polysiloxane composition of the present invention may optionally contain various additives (e.g. phosphors, colorants, and heat-resistance improving agents), reaction control agents, mold release agents, and dispersants for fillers. Examples of the dispersants for fillers include diphenylsilanediol, various alkoxysilanes, carbon-functional silanes, and silanol group-containing siloxanes with low molecular weights. These optional components are preferably used in minimum amounts so that they do not impair the effects of the present invention.

In order to prepare the polysiloxane composition of the present invention, the above components may be uniformly mixed with a kneading machine such as a roll mill, Banbury mixer, or kneader, or with a planetary stirring and defoaming apparatus, and the resulting mixture may optionally be subjected to heating treatment.

The polysiloxane composition of the present invention can be used in the form of a molded product. The molding method may be any method such as extrusion molding, compression molding, blow molding, calendar molding, vacuum molding, foam molding, injection molding, liquid injection molding, and cast molding.

Specific examples of applications of the molded products obtained in the present invention include, in the liquid crystal display field, peripheral materials for liquid crystal display devices such as substrate materials, light guide plates, prism sheets, polarizing plates, retardation films, viewing angle compensation films, adhesives, color filters, and films for LCD such as polarizer protective films and passivation films. Other examples thereof include materials for PDPs (plasma display panels), such as encapsulants, anti-reflection films, optical compensation films, housing materials, protection films for front glass, alternative materials for front glass, adhesives, color filters, and passivation films; materials for LED display devices, such as molding materials for LED elements, protection films for front glass, alternative materials for front glass, adhesives, color filters, and passivation films; materials for plasma address liquid crystal displays, such as substrate materials, light guide plates, prism sheets, polarizing plates, retardation films, viewing angle compensation films, adhesives, color filters, polarizer protective films, and passivation films; materials for organic EL displays, such as protection films for front glass, alternative materials for front glass, color filters, adhesives, and passivation films; and materials for field emission displays (FEDs), such as various film substrates, protection films for front glass, alternative materials for front glass, adhesives, color filters, and passivation films.

Examples of the applications in the automotive and transport fields include materials for automobiles, such as lamp reflectors, bearing retainers, gear parts, corrosion-resistant coatings, switch parts, headlamps, inner parts of the engine, electrical parts, various interior and exterior parts, driving engines, brake-oil tanks, rust-proof steel plates for automobiles, interior panels, interior materials, protecting/binding wire harnesses, fuel hoses, automotive lamps, and glass substitutes. Examples of the applications also include multilayer glasses for railway vehicles. Examples of the applications also include materials for aircrafts, such as toughening agents for structural materials, peripheral members of the engine, protecting/binding wire harnesses, and corrosion-resistant coatings.

Examples of the applications in the architecture field include interior/processing materials, lamp covers, sheets, glass interlayer films, glass substitutes, and peripheral materials for solar cells. Examples thereof in the agricultural field include cover films for greenhouses.

Examples of the applications as next generation optical/electronic functional organic materials include next-generation DVDs; peripheral materials for organic EL elements; organic photorefractive elements; light-light conversion devices such as optical amplifiers and optical computing elements; substrate materials and fiber materials for the peripherals of organic solar cells; and encapsulants and adhesives for elements. The polysiloxane composition obtained in the present invention can also be used for optical devices described below.

<Viscoelastic Behavior of Cured Article>

The cured article formed from the polysiloxane composition of the present invention shows a specific viscoelastic behavior.

When a sine wave vibration stress (strain) with an angular frequency ω is applied, the complex modulus determined by the strain and stress is generally represented by the equation: $E^*=E'+iE''$. Here, $E'$ represents a storage elastic modulus, and $E''$ represents a loss elastic modulus. If the phase difference between the stress and strain is δ, the loss tangent (tan δ) is represented by $E''/E'$.

The cured article of the present invention has at least one loss tangent peak in a temperature range of −40° C. to 50° C., and has a storage elastic modulus at 50° C. of 10 MPa or lower. The loss tangent peak is preferably in the range of −5° C. to 45° C., and more preferably of 0° C. to 45° C. If the peak is present at lower temperatures, the cured article may have low gas-barrier properties. If the peak is present at higher temperatures, the internal (residual) stress of the cured article during its formation may increase, thereby leading to deterioration of the hot and cold impact resistance of the cured article. The storage elastic modulus at 50° C. is more preferably not more than 8 MPa, and further preferably not more than 5 MPa. The storage elastic modulus at 50° C. of more than 10 MPa may lead to deterioration of the hot and cold impact resistance of the cured article.

The cured article with a viscoelastic behavior in the above range enables the production of satisfactory optical devices without troubles such as cracks in an encapsulant layer, which could occur during the production of optical devices.

<Optical Device>

The optical device of the present invention is obtained by using the polysiloxane composition of the present invention.

The use of the polysiloxane composition of the present invention enables low water vapor permeability (excellent gas-barrier properties) and therefore the polysiloxane composition is useful as an encapsulant for optical elements. Also, optical devices including the encapsulant can be prepared.

Specific examples of the optical device of the present invention, for example, in the optical recording field, include VDs (video disks), CD/CD-ROMs, CD-R/RWs, DVD-R/DVD-RAMS, MO/MDs, PDs (phase-change disks), and optical cards, such as disk substrate materials, pickup lenses, protective films, and encapsulants. More specifically, the present invention can be suitably used for materials for optical pickups of next-generation DVDs and the like, such as pickup lenses, collimator lenses, objective lenses, sensor lenses, protective films, encapsulants for elements, encapsulants for sensors, gratings, adhesives, prisms, wave plates, correcting plates, splitters, holograms, and mirrors.

Examples of the applications in the optical equipment field include materials for still cameras, such as materials for lenses, prism finders, target prisms, finder covers, and light sensors; materials for video cameras, such as taking lenses and finders; materials for projection televisions, such as projector lenses, protective films, encapsulants, and adhesives; and materials for optical sensing equipment, such as materials for lenses, encapsulants, adhesives, and films.

Examples of the applications in the optical components field include peripheral materials for optical switches in optical communication systems, such as fiber materials, lenses, waveguides, and encapsulants and adhesives for elements; peripheral materials for optical connectors, such as optical fiber materials, ferrules, encapsulants, and adhesives; materials for passive optical components and optical circuit components, such as lenses, waveguides, and encapsulants and adhesives for LED elements; peripheral materials for opto-electronic integrated circuits (OEIC), such as substrate materials, fiber materials, and encapsulants and adhesives for elements.

Examples of the applications in the optical fiber field include materials for decoration displays, such as lightings and light guides; sensors, indications, signs and the like for industrial use; and optical fibers for communications infrastructures and for home networking of digital devices.

Examples of the applications as peripheral materials for semiconductor integrated circuits include interlayer insulator, passivation films, resist materials for microlithography for LSI and Ultra LSI materials.

EXAMPLES

The present invention is described in greater detail, referring to examples which do not limit the present invention.

Examples 1 to 5 and Comparative Examples 1 to 3

Examples 1 to 5 and Comparative Examples 1 to 3 were evaluated by the following methods. The results are shown in Table 1.

(Visual Evaluation)

Two glass plates each having a size of 10 cm×10 cm were washed with pure water and dried. A fluorinated mold release agent (Daifree, GA6010, product of Daikin Industries, Ltd.) was sprayed and uniformly spread on the glass plates with a kimwipe, and the excess of the agent was removed. A spacer was prepared by winding a teflon (registered trademark) seal around a 2-mm-thick U-shaped silicone rubber. The spacer was then sandwiched between the two glass plates, and the resulting product was fixed by clips and heat-dried at 150° C. for one hour to prepare a glass cell.

A polysiloxane composition was poured into the glass cell and heat-cured in a convection oven for two hours at 80° C. followed by one hour at 100° C. and then six hours at 150° C. to produce a cured article (2-mm-thick molded plate).

(Initial State)

The 2-mm-thick molded plate was visually observed. A molded plate not discolored by stains and the like was evaluated as "good", and a molded plate discolored was evaluated as "bad".

(Heat Resistance Test)

The 2-mm-thick molded plate was aged for 24 hours in a hot air circulating oven set at 200° C., and the resulting molded plate was visually observed. A molded plate not discolored by stains and the like was evaluated as "good", and a molded plate discolored was evaluated as "bad".

(Light Resistance Test)

A Metaling Weather Meter (model M6T, product of Suga Test Instruments Co., Ltd.) was used. The 2-mm-thick molded plate was irradiated at a black panel temperature of 120° C. and an irradiance of 0.53 kW/m² until the total irradiance reached 50 MJ/m². The resulting molded plate was visually observed. A molded plate not discolored by stains and the like was evaluated as "good", and a molded plate discolored was evaluated as "bad".

(Water Vapor Permeability Test)

A mold was filled with an encapsulant and the encapsulant was heat-cured in a convection oven for two hours at 80° C. followed by one hour at 100° C. and then six hours at 150° C. to prepare a 2-mm-thick specimen. The thus-obtained cured article was aged at a room temperature of 25° C. and a humidity of 55% RH for 24 hours.

The water vapor permeability was determined according to the following method.

On a 5-cm-square glass plate (thickness: 0.5 mm), a 5-cm-square sheet of polyisobutylene rubber (thickness: 3 mm, a 3-cm-square part inside the sheet had been cut out to make a hollow square) was fixed to prepare a jig. The hollow part was filled with 1 g of calcium chloride (for water content measurement, product of Wako Pure Chemical Industries, Ltd.) to prepare a specimen. Further, a 5-cm-square cured article (thickness: 2 mm) for evaluation was fixed thereon, and the resulting specimen was aged in a constant temperature and humidity chamber (PR-2 KP, product of Espec Corporation) at a temperature of 40° C. and a humidity of 90% RH for 24 hours. The water vapor permeability was calculated according to the following equation:

Water vapor permeability $(g/m^2/24\ h)$=[(Total weight (g) of specimen after water vapor permeability test)−(Total weight (g) of specimen before water vapor permeability test)]×$10000/9.0\ cm^2$.

(Hydrogen Sulfide Test ($H_2S$ Test))

A composition was injected into an LED package (product of Enomoto Co., Ltd., product name: TOP LED 1-IN-1, external dimensions: 3528 (3.5 mm×2.8 mm×1.9 mm), inner diameter: 2.4 mm) and heat-cured in a convection oven for two hours at 80° C. followed by one hour at 100° C. and then six hours at 150° C. to prepare a specimen. The specimen was subjected to a hydrogen sulfide exposure test in a flow gas corrosion tester (KG130S, product of Fact K Co., Ltd.) for 96 hours under the conditions of 40° C., 80% RH, and 3 ppm of hydrogen sulfide. A reflector of the package not discolored after the test was evaluated as "good", a reflector slightly discolored was evaluated as "poor", and a reflector blackened was evaluated as "bad".

Production Example 1

Tetraethoxysilane (1083 g) was added to a 48% aqueous solution of choline (aqueous solution of trimethyl(2-hydroxyethyl) ammonium hydroxide, 1262 g), and the mixture was vigorously stirred at room temperature for two hours. When the reaction system generated heat and turned into a homogeneous solution, the stirring was slowed down and the reaction was further continued for 12 hours. Then, to a solid formed in the reaction system, methanol (1000 mL) was added to give a homogeneous solution.

The methanol solution was slowly added dropwise to a vigorously stirred solution of dimethylvinylchlorosilane (537 g), trimethylsilyl chloride (645 g), and hexane (1942 mL). After completion of the dropwise addition, the resulting mixture was reacted for one hour. Then, the organic layer was extracted and condensed to obtain a solid. The formed solid was washed in methanol by vigorous stirring, and filtered to obtain 536 g of a white solid of tris(vinyldimethylsiloxy)pentakis(trimethylsiloxy)octasilsesquioxane, which was an alkenyl group-containing polyhedral polysiloxane compound with 16 Si atoms and 3 vinyl groups.

Production Example 2

The tris(vinyldimethylsiloxy)pentakis(trimethylsiloxy)octasilsesquioxane (80.0 g), which was a polyhedral polysiloxane compound obtained in Production Example 1, was dissolved in toluene (120.0 g). Furthermore, 11.22 µL of a xylene solution of a platinum-vinylsiloxane complex (Pt-VTSC-3X, platinum-vinylsiloxane complex containing 3 wt % of platinum, product of Umicore Precious Metals Japan Co., Ltd.) was dissolved in the resulting solution.

The thus-obtained solution was slowly added dropwise to a solution of 1,3,5,7-tetrahydrogen-1,3,5,7-tetramethylcyclotetrasiloxane (123.76 g) and toluene (123.76 g). The resulting mixture was reacted at 95° C. for three hours, and then cooled to room temperature.

After completion of the reaction, the toluene and the excess of 1,3,5,7-tetrahydrogen-1,3,5,7-tetramethylcyclotetrasiloxane were evaporated to obtain 115.6 g of a liquid, modified polyhedral polysiloxane (SiH value: 4.77 mol/kg as determined by $^1$H-NMR).

Production Example 3

The tris(vinyldimethylsiloxy)pentakis(trimethylsiloxy) octasilsesquioxane (20.0 g), which was a polyhedral polysiloxane compound obtained in Production Example 1, was dissolved in toluene (40.0 g). Furthermore, 3.85 µL of a xylene solution of a platinum-vinylsiloxane complex (Pt-VTSC-3X, platinum-vinylsiloxane complex containing 3 wt % of platinum, product of Umicore Precious Metals Japan Co., Ltd.) was dissolved in the resulting solution.

The resulting solution was slowly added dropwise to a solution of 1,3,5,7-tetrahydrogen-1,3,5,7-tetramethylcyclotetrasiloxane (20.62 g), 1,1,3,3-tetramethyldisiloxane (11.52 g), and toluene (32.14 g). The resulting mixture was reacted at 95° C. for three hours, and then cooled to room temperature.

After completion of the reaction, the toluene and the excesses of 1,3,5,7-tetrahydrogen-1,3,5,7-tetramethylcyclotetrasiloxane and 1,1,3,3-tetramethyldisiloxane were evaporated to obtain 29.0 g of a liquid, modified polyhedralpolysiloxane (SiH value: 3.93 mol/kg).

Example 1

To the modified polyhedral polysiloxane (5.00 g, SiH value: 4.77 mol/kg) obtained in Production Example 2 was added a vinyl group-containing phenylsiloxane (2.56 g, FX-T350, product of Adeka Corporation, weight-average molecular weight: 460, Vi value: 7.41 mol/kg), and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

Example 2

To the modified polyhedral polysiloxane (5.00 g, SiH value: 4.77 mol/kg) obtained in Production Example 2 was added a vinyl group-containing phenylsiloxane (2.71 g, FX-T180, product of Adeka Corporation, weight-average molecular weight: 490, Vi value: 5.02 mol/kg), and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

Example 3

To the modified polyhedral polysiloxane (5.00 g, SiH value: 4.77 mol/kg) obtained in Production Example 2 were added 1,5-divinyl-3,3-diphenyl-1,1,5,5-tetramethyltrisiloxane (2.23 g, SID4609.0, product of Gelest, weight-average molecular weight: 385, Vi value: 5.20 mol/kg) and 3-glycidoxypropyltrimethoxysilane (0.23 g, SH6040, product of Dow Corning Toray Co., Ltd.), and the mixture was stirred.

After further addition of ethynylcyclohexanol (0.56 µl) and dimethyl maleate (0.64 µl) and then stirring, the resulting mixture was stirred and defoamed by a planetary stirring and defoaming apparatus to obtain a polysiloxane composition. This composition was poured into a mold and an LED package, and then heat-cured for two hours at 80° C. followed by one hour at 100° C. and then six hours at 150° C. to produce molded products for evaluation.

Example 4

To the modified polyhedral polysiloxane (5.00 g, SiH value: 3.93 mol/kg) obtained in Production Example 3 were added 1,5-divinyl-3,3-diphenyl-1,1,5,5-tetramethyltrisiloxane (2.62 g, SID4609.0, product of Gelest, weight-average molecular weight: 385, Vi value: 5.20 mol/kg) and 3-glycidoxypropyltrimethoxysilane (0.23 g, SH6040, product of Dow Corning Toray Co., Ltd.), and the mixture was stirred.

After further addition of ethynylcyclohexanol (0.56 µl) and dimethyl maleate (0.64 µl) and then stirring, the resulting mixture was stirred and defoamed by a planetary stirring and defoaming apparatus to obtain a polysiloxane composition. This composition was poured into a mold and an LED package, and then heat-cured for two hours at 80° C. followed by one hour at 100° C. and then six hours at 150° C. to produce molded products for evaluation.

Example 5

To the modified polyhedral polysiloxane (2.00 g, SiH value: 4.77 mol/kg) obtained in Production Example 2 was added a phenylsiloxane (9.53 g, product of Gelest, product name: PMV9925, weight-average molecular weight: 3000, Vi value: 0.67 mol/kg) containing a vinyl group at both ends, and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

Comparative Example 1

To the modified polyhedral polysiloxane (1.00 g) obtained in Production Example 2 was added a vinyl group-containing phenylsiloxane (9.52 g, FX-T153, product of Adeka corporation, weight-average molecular weight: 5000, Vi value: 0.40 mol/kg), and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

Comparative Example 2

To the modified polyhedral polysiloxane (0.50 g) obtained in Production Example 2 was added a phenylsiloxane (11.90 g, product of Gelest, product name: PDV2331, weight-average molecular weight: 10000, Vi value: 0.20 mol/kg) containing a vinyl group at both ends, and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

Comparative Example 3

To the modified polyhedral polysiloxane (5.00 g) obtained in Production Example 2 was added a straight-chain polydimethylsiloxane (8.33 g, product of Clariant, product name: MVD8V, weight-average molecular weight: 780, Vi value: 2.56 mol/kg) containing a vinyl group at both ends, and the mixture was well mixed to obtain a polysiloxane composition. This composition was poured into a mold and an LED package, and then heat-cured for two hours at 80° C. followed by one hour at 100° C. and then six hours at 150° C. to produce molded products for evaluation.

TABLE 1

| | Visual evaluation | | | | |
| --- | --- | --- | --- | --- | --- |
| Example | Initial state | Heat resistance test | Light resistance test | Water vapor permeability (g/m$^2$ · 24 h) | H$_2$S test |
| Example 1 | good | good | good | 11.2 | good |
| Example 2 | good | good | good | 15.9 | good |
| Example 3 | good | good | good | 13.8 | good |
| Example 4 | good | good | good | 19.1 | good |
| Example 5 | good | good | good | 22.4 | poor |
| Comparative Example 1 | good | good | good | 32.5 | bad |
| Comparative Example 2 | good | good | good | 41.8 | bad |
| Comparative Example 3 | good | good | good | 51.5 | bad |

As the table shows, the molded products formed from the polysiloxane compositions of Examples 1 to 5 have high heat resistance and light resistance and are excellent in gas-barrier properties. Accordingly, the polysiloxane composition of the present invention is suitable for the production of cured articles which have low water vapor permeability and thus are usable as encapsulants for optical elements, particularly suitable for the production of encapsulants for optical devices.

Examples 6 to 12 and Comparative Examples 4 to 6

Evaluation of the products of Examples 6 to 12 and Comparative Examples 4 to 6 was performed according to the following methods. The results are shown in Table 2.
(Visual Evaluation)

The evaluation was performed in the same manner as in Examples 1 to 5 and Comparative Examples 1 to 3.
(Crack Test)

Two pieces of single crystal silicon chips with a size of 0.4 mm×0.4 mm×0.2 mm were bonded to an LED package (product of Enomoto Co., Ltd., product name: TOP LED 1-IN-1, external dimensions: 3528 (3.5 mm×2.8 mm×1.9 mm), inner diameter: 2.4 mm) with an epoxy adhesive (product of Henkel Japan Ltd., product name: Loctite 348), and the resulting LED package was placed in an oven at 150° C. for 30 minutes. A polysiloxane composition was injected into the resulting LED package, and then heat-cured in a convection oven for two hours at 80° C. followed by one hour at 100° C. and then six hours at 150° C. to prepare a specimen. The cured specimen was observed by a microscope. A specimen with no change was evaluated as "good", and a specimen with cracks or a specimen peeled off the package was evaluated as "bad".

(Thermal Shock Test, Heat Cycle (H/C) Test)

A polysiloxane composition was injected into an LED package mentioned above, and then heat-cured in a convection oven for two hours at 80° C. followed by one hour at 100° C. and then six hours at 150° C. to prepare a specimen. The specimen was subjected to 100 cycles of high temperature exposure at 100° C. for 30 minutes followed by low temperature exposure at −40° C. for 30 minutes with a thermal shock tester (TSA-71H-W, product of Espec Corporation). The resulting specimen was observed with a microscope. A specimen with no change after the test was evaluated as "good", and a specimen with cracks or a specimen peeled off the package was evaluated as "bad".

(Water Vapor Permeability Test)

The test was performed in the same manner as in Examples 1 to 5 and Comparative Examples 1 to 3.

(Hydrogen Sulfide Test ($H_2S$ Test))

The test was performed in the same manner as in Examples 1 to 5 and Comparative Examples 1 to 3.

(Preparation of Specimen for Measurement of Dynamic Viscoelasticity)

A mold was filled with a polysiloxane composition and the composition was heat-cured in a convection oven for two hours at 80° C. followed by one hour at 100° C. and then six hours at 150° C. to prepare a specimen with a size of 35 mm in length, 5 mm in width, and 2 mm in thickness.

(Measurement of Dynamic Viscoelasticity)

The dynamic viscoelasticity of the thus-prepared specimen was measured by a dynamic viscoelasticity measuring apparatus (Reogel E4000, product of UBM) at a measurement temperature of −40° C. to 150° C., a temperature increase rate of 4° C./min, a strain of 4 µm, a frequency of 10 Hz, a distance between chucks of 25 mm and in a tensile mode.

Example 6

To the modified polyhedral polysiloxane (5.00 g, SiH value: 4.77 mol/kg) obtained in Production Example 2 were added 1,5-divinyl-3,3-diphenyl-1,1,5,5-tetramethyltrisiloxane (1.74 g, SID4609.0, product of Gelest, weight-average molecular weight: 385, Vi value: 5.20 mol/kg) and vinyldiphenylmethylsilane (1.90 g, LS5600, product of Shin-Etsu Chemical Co., Ltd., weight-average molecular weight: 225, Vi value: 4.44 mol/kg), and the mixture was stirred. The resulting mixture was stirred and defoamed by a planetary stirring and defoaming apparatus to obtain a polysiloxane composition. This polysiloxane composition was evaluated according to each test described above. The results are shown in Table 2.

Example 7

To the modified polyhedral polysiloxane (5.00 g, SiH value: 4.77 mol/kg) obtained in Production Example 2 were added 1,5-divinyl-3,3-diphenyl-1,1,5,5-tetramethyltrisiloxane (1.74 g, SID4609.0, product of Gelest, weight-average molecular weight: 385, Vi value: 5.20 mol/kg), vinyldiphenylmethylsilane (1.90 g, LS5600, product of Shin-Etsu Chemical Co., Ltd., weight-average molecular weight: 225, Vi value: 4.44 mol/kg), and 3-glycidoxypropyltrimethoxysilane (0.21 g, SH6040, product of Dow Corning Toray Co., Ltd.), and the mixture was stirred. After further addition of ethynylcyclohexanol (0.21 µl), dimethyl maleate (0.10 µl), and N,N,N',N'-tetramethylethylenediamine (0.016 µl) and then stirring, 0.10 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 2.

Example 8

To the modified polyhedral polysiloxane (5.00 g, SiH value: 4.77 mol/kg) obtained in Production Example 2 were added a phenylsiloxane (4.33 g, FX-T180, product of Adeka corporation, weight-average molecular weight: 490, Vi value: 5.02 mol/kg) containing a vinyl group at both ends, diphenylmethylsilane (1.25 g, SID4555.0, product of Gelest, SiH value: 5.03 mol/kg), and 3-glycidoxypropyltrimethoxysilane (0.32 g, SH6040, product of Dow Corning Toray Co., Ltd.), and the mixture was stirred. After further addition of ethynylcyclohexanol (0.48 µl) and dimethyl maleate (0.56 µl) and then stirring, 0.24 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 2.

Example 9

To the modified polyhedral polysiloxane (5.00 g, SiH value: 4.77 mol/kg) obtained in Production Example 2 were added a phenylsiloxane (1.92 g, FX-T180, product of Adeka Corporation, weight-average molecular weight: 490, Vi value: 5.02 mol/kg) containing a vinyl group at both ends, vinylpentamethyldisiloxane (1.23 g, SIV 9090.0, product of Gelest, Vi value: 5.68 mol/kg), and 3-glycidoxypropyltrimethoxysilane (0.20 g, SH6040, product of Dow Corning Toray Co., Ltd.), and the mixture was stirred. After further addition of ethynylcyclohexanol (0.21 µl) and dimethyl maleate (0.10 µl) and then stirring, 0.12 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 2.

Example 10

To the modified polyhedral polysiloxane (5.00 g, SiH value: 3.93 mol/kg) obtained in Production Example 3 were added 1,5-divinyl-3,3-diphenyl-1,1,5,5-tetramethyltrisiloxane (1.64 g, SID4609.0, product of Gelest, weight-average molecular weight: 385, Vi value: 5.20 mol/kg), vinyldiphenylmethylsilane (1.17 g, LS5600, product of Shin-Etsu Chemical Co., Ltd., weight-average molecular weight: 225, Vi value: 4.44 mol/kg), and 3-glycidoxypropyltrimethoxysilane (0.19 g, SH6040, product of Dow Corning Toray Co., Ltd.), and the mixture was stirred. After addition of ethynylcyclohexanol (0.22 μl), dimethyl maleate (0.11 μl), and N,N,N',N'-tetramethylethylenediamine (0.016 μl) and then stirring, the resulting mixture was stirred and defoamed by a planetary stirring and defoaming apparatus to obtain a polysiloxane composition. This polysiloxane composition was evaluated according to each test described above. The results are shown in Table 2.

Example 11

To the modified polyhedral polysiloxane (5.00 g, SiH value: 4.77 mol/kg) obtained in Production Example 2 were added a vinyl group-terminated straight-chain polydimethylsiloxane (2.20 g, DMS-V03, product of Gelest), vinyldiphenylmethylsilane (2.40 g, LS5600, product of Shin-Etsu Chemical Co., Ltd., weight-average molecular weight: 225, Vi value: 4.44 mol/kg), and 3-glycidoxypropyltrimethoxysilane (0.24 g, SH6040, product of Dow Corning Toray Co., Ltd.), and the mixture was stirred. After further addition of ethynylcyclohexanol (0.21 μl) and dimethyl maleate (0.10 μl) and then stirring, 0.14 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. After N,N,N',N'-tetramethylethylenediamine (0.006 μl) was further added and stirred, the resulting mixture was stirred and defoamed by a planetary stirring and defoaming apparatus to obtain a polysiloxane composition. This polysiloxane composition was evaluated according to each test described above. The results are shown in Table 2.

Example 12

To the modified polyhedral polysiloxane (5.00 g, SiH value: 4.77 mol/kg) obtained in Production Example 2 were added 1,5-divinyl-3,3-diphenyl-1,1,5,5-tetramethyltrisiloxane (1.96 g, SID4609.0, product of Gelest, weight-average molecular weight: 385, Vi value: 5.20 mol/kg), vinyldiphenylmethylsilane (2.03 g, LS5600, product of Shin-Etsu Chemical Co., Ltd., weight-average molecular weight: 225, Vi value: 4.44 mol/kg), and 3-glycidoxypropyltrimethoxysilane (0.22 g, SH6040, product of Dow Corning Toray Co., Ltd.), and the mixture was stirred. Furthermore, fumed silica (0.539 g, R812, product of Nippon Aerosil Co., Ltd., average primary particle size: 7 nm, BET specific surface area: 260 (m$^2$/g)) was added and the resulting mixture was stirred. After further addition of ethynylcyclohexanol (0.42 μl), dimethyl maleate (0.10 μl), and N,N,N',N'-tetramethylethylenediamine (0.007 μl) and then stirring, 0.35 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 2.

Comparative Example 4

To the modified polyhedral polysiloxane (5.00 g, SiH value: 4.77 mol/kg) obtained in Production Example 2 were added a phenylsiloxane (2.71 g, FX-T180A, product of Adeka Corporation) containing a vinyl group at both ends, and 3-glycidoxypropyltrimethoxysilane (0.23 g, SH6040, product of Dow Corning Toray Co., Ltd.), and the mixture was stirred. After further addition of ethynylcyclohexanol (0.56 μl) and dimethyl maleate (0.64 μl) and then stirring, 0.10 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a composition. This composition was evaluated according to each test described above. The results are shown in Table 2.

Comparative Example 5

To the modified polyhedral polysiloxane (5.00 g, SiH value: 4.77 mol/kg) obtained in Production Example 2 were added a vinyl group-terminated straight-chain polydimethylsiloxane (5.45 g, MVD8MV, product of Clariant, weight-average molecular weight: 780, Vi value: 2.56 mol/kg), and 3-glycidoxypropyltrimethoxysilane (0.31 g, SH6040, product of Dow Corning Toray Co., Ltd.), and the mixture was stirred. After further addition of ethynylcyclohexanol (0.56 μl) and dimethyl maleate (0.65 μl) and then stirring, 0.10 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a composition. This composition was evaluated according to each test described above. The results are shown in Table 2.

Comparative Example 6

To the modified polyhedral polysiloxane (5.00 g, SiH value: 4.77 mol/kg) obtained in Production Example 2 were added a vinyl group-terminated straight-chain polydimethylsiloxane (5.45 g, MVD8MV, product of Clariant, weight-average molecular weight: 780, Vi value: 2.56 mol/kg), 3-glycidoxypropyltrimethoxysilane (0.31 g, SH6040, product of Dow Corning Toray Co., Ltd.), and then fumed silica (1.45 g, product of Nippon Aerosil Co., Ltd., product name: Aerosil R812, average primary particle size: 7 nm, BET specific surface area: 260 (m$^2$/g)), and the mixture was stirred. After further addition of ethynylcyclohexanol (0.56 μl), and dimethyl maleate (0.65 μl) and then stirring, 0.10 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a composition. This composition was evaluated according to each test described above. The results are shown in Table 2.

TABLE 2

| Example | Visual evaluation | | | Crack resistance | | Water vapor permeability (g/m² · 24 h) | H₂S test | Storage elastic modulus (MPa, at 50° C.) | Position of loss tangent peak (° C.) |
|---|---|---|---|---|---|---|---|---|---|
| | Initial state | Heat resistance test | Light resistance test | Initial state | H/C test | | | | |
| Example 6 | good | good | good | good | good | 9 | good | 3 | 18 |
| Example 7 | good | good | good | good | good | 11 | good | 2 | 18 |
| Example 8 | good | good | good | good | good | 13 | good | 6 | 15 |
| Example 9 | good | good | good | good | good | 17 | good | 4 | 16 |
| Example 10 | good | good | good | good | good | 15 | good | 3 | 22 |
| Example 11 | good | good | good | good | good | 19 | good | 5 | −36 |
| Example 12 | good | good | good | good | good | 10 | good | 5 | 23 |
| Comparative Example 4 | good | good | good | poor | bad | 12 | good | 10 | 27 |
| Comparative Example 5 | good | good | good | good | good | 41 | bad | 8 | below −40 |
| Comparative Example 6 | good | good | good | good | good | 36 | bad | 11 | −28 |

As the table shows, the molded products formed from the polysiloxane compositions of Examples 6 to 12 have high heat resistance and light resistance and are excellent in gas-barrier properties and crack resistance including hot and cold impact resistance. Accordingly, the polysiloxane composition of the present invention is suitable for the production of cured articles which have low water vapor permeability and thus are usable as encapsulants for optical elements, particularly suitable for the production of encapsulants for optical devices.

Examples 13 to 16 and Comparative Examples 7 and 8

Evaluation of the products of Examples 13 to 16 and Comparative Examples 7 and 8 was performed according to the following methods. The results are shown in Table 3.
(Visual Evaluation)
The evaluation was performed in the same manner as in Examples 1 to 5 and Comparative Examples 1 to 3.
(Crack Test)
The test was performed in the same manner as in Examples 6 to 12 and Comparative Examples 4 to 6.
(Thermal Shock Test, Heat Cycle (H/C) Test)
The test was performed in the same manner as in Examples 6 to 12 and Comparative Examples 4 to 6.
(Water Vapor Permeability Test)
The test was performed in the same manner as in Examples 6 to 12 and Comparative Examples 4 to 6.
(Hydrogen Sulfide Test (H₂S Test))
The test was performed in the same manner as in Examples 6 to 12 and Comparative Examples 4 to 6.
(Preparation of Specimen for Measurement of Dynamic Viscoelasticity)
The preparation was performed in the same manner as in Examples 6 to 12 and Comparative Examples 4 to 6.
(Measurement of Dynamic Viscoelasticity)
The measurement was performed in the same manner as in Examples 6 to 12 and Comparative Examples 4 to 6.

Example 13

To the modified polyhedral polysiloxane (5.00 g, SiH value: 4.77 mol/kg) obtained in Production Example 2 were added a phenylsiloxane (1.73 g, product of Adeka Corporation, weight-average molecular weight: 385, Vi value: 5.02 mol/kg) containing a vinyl group at both ends, and camphene (1.25 g, weight-average molecular weight: 136, Vi value: 7.35 mol/kg), and the mixture was stirred. The resulting mixture was stirred and defoamed by a planetary stirring and defoaming apparatus to obtain a polysiloxane composition. This polysiloxane composition was evaluated according to each test described above. The results are shown in Table 3.

Example 14

To the modified polyhedral polysiloxane (5.00 g, SiH value: 4.77 mol/kg) obtained in Production Example 2 were added a phenylsiloxane (1.73 g, FX-T180, product of Adeka Corporation, weight-average molecular weight: 490, Vi value: 5.02 mol/kg) containing a vinyl group at both ends, β-pinene (1.09 g, weight-average molecular weight: 136, Vi value: 7.35 mol/kg), and 3-glycidoxypropyltrimethoxysilane (0.20 g, SH6040, product of Dow Corning Toray Co., Ltd.), and the mixture was stirred. The resulting mixture was stirred and defoamed by a planetary stirring and defoaming apparatus to obtain a polysiloxane composition. This polysiloxane composition was evaluated according to each test described above. The results are shown in Table 3.

Example 15

To the modified polyhedral polysiloxane (5.00 g, SiH value: 3.93 mol/kg) obtained in Production Example 3 were added 1,5-divinyl-3,3-diphenyl-1,1,5,5-tetramethyltrisiloxane (1.45 g, weight-average molecular weight: 385, Vi value: 5.20 mol/kg) and camphene (0.94 g, weight-average molecular weight: 136, Vi value: 7.35 mol/kg), and the mixture was stirred. After further addition of ethynylcyclohexanol (0.21 μl), dimethyl maleate (0.11 μl), and N,N,N', N'-tetramethylethylenediamine (0.008 μl) and then stirring, 0.10 μl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 3.

Example 16

To the modified polyhedral polysiloxane (5.00 g, SiH value: 4.77 mol/kg) obtained in Production Example 2 were added a vinyl group-terminated straight-chain polydimethylsiloxane (2.03 g, DMS-V03, product of Gelest, weight-average molecular weight: 500, Vi value: 4.00 mol/kg), camphene (1.32 g, weight-average molecular weight: 136, Vi value: 7.35 mol/kg), and 3-glycidoxypropyltrimethoxysilane (0.21 g, SH6040, product of Dow Corning Toray Co., Ltd.), and the mixture was stirred. Furthermore, fumed silica (0.42 g, R812, product of Nippon Aerosil Co., Ltd., average primary particle size: 7 nm, BET specific surface area: 260 (m$^2$/g)) was added and the resulting mixture was stirred. After further addition of ethynylcyclohexanol (0.21 µl) and dimethyl maleate (0.10 µl) and then stirring, 0.14 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a polysiloxane composition. This polysiloxane composition was evaluated according to each test described above. The results are shown in Table 3.

Comparative Example 7

To the modified polyhedral polysiloxane (5.00 g, SiH value: 4.77 mol/kg) obtained in Production Example 2 were added a phenylsiloxane (2.71 g, FX-T180, product of Adeka Corporation, weight-average molecular weight: 490, Vi value: 5.02 mol/kg) containing a vinyl group at both ends, and 3-glycidoxypropyltrimethoxysilane (0.23 g, SH6040, product of Dow Corning Toray Co., Ltd.), and the mixture was stirred. After further addition of ethynylcyclohexanol (0.56 µl) and dimethyl maleate (0.64 µl) and then stirring, 0.10 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a composition. This composition was evaluated according to each test described above. The results are shown in Table 3.

Comparative Example 8

To the modified polyhedral polysiloxane (5.00 g, SiH value: 4.77 mol/kg) obtained in Production Example 2 were added a vinyl group-terminated straight-chain polydimethylsiloxane (5.45 g, MVD8MV, product of Clariant, weight-average molecular weight: 780, Vi value: 2.56 mol/kg) and 3-glycidoxypropyltrimethoxysilane (0.31 g, SH6040, product of Dow Corning Toray Co., Ltd.), and the mixture was stirred. After further addition of ethynylcyclohexanol (0.56 µl) and dimethyl maleate (0.65 µl) and then stirring, 0.10 µl of a xylene solution of a platinum-vinylsiloxane complex (Pt-VTSC-3X, platinum-vinylsiloxane complex containing 3 wt % of platinum, product of Umicore Precious Metals Japan Co., Ltd.) was added to the mixture and then stirred. The resulting mixture was stirred and defoamed by a planetary stirring and defoaming apparatus to obtain a composition. This composition was evaluated according to each test described above. The results are shown in Table 3.

TABLE 3

| | Visual evaluation | | | Crack resistance | | Water vapor permeability ($g/m^2 \cdot 24$ h) | $H_2S$ test | Storage elastic modulus (MPa, at 50° C.) | Position of loss tangent peak (° C.) |
|---|---|---|---|---|---|---|---|---|---|
| Example | Initial state | Heat resistance test | Light resistance test | Initial state | H/C test | | | | |
| Example 13 | good | good | good | good | good | 8 | good | 8 | 30 |
| Example 14 | good | good | good | good | good | 11 | good | 5 | 23 |
| Example 15 | good | good | good | good | good | 15 | good | 3 | 14 |
| Example 16 | good | good | good | good | good | 13 | good | 4 | 18 |
| Comparative Example 7 | good | good | good | poor | bad | 12 | good | 10 | 27 |
| Comparative Example 8 | good | good | good | good | good | 41 | bad | 8 | below −40 |

As the table shows, the cured articles formed from the polysiloxane compositions of Examples 13 to 16 have high heat resistance and light resistance and are excellent in gas-barrier properties and crack resistance including hot and cold impact resistance. Accordingly, the polysiloxane composition of the present invention is suitable for the production of cured articles which have low water vapor permeability and thus are usable as encapsulants for optical elements, particularly suitable for the production of encapsulants for optical devices.

The invention claimed is:

1. A polysiloxane composition, comprising:
  (A) a modified polyhedral polysiloxane which is obtained by modifying (a) an alkenyl group-containing polyhedral polysiloxane compound with (b) a hydrosilyl group-containing compound; and
  (B) an organopolysiloxane that contains at least two alkenyl groups in a molecule,
  wherein the organopolysiloxane (B) contains an aryl group and has a weight-average molecular weight of 200 to 1000 and
  wherein the polysiloxane composition after curing has a water vapor permeability of not more than 20 g/m$^2$/24 h, and
  wherein a cured article obtained by using the polysiloxane composition has a storage elastic modulus at 50° C. of 10 MPa or lower.

2. The polysiloxane composition according to claim 1, wherein the modified polyhedral polysiloxane (A) is in a liquid form at 20° C.

3. The polysiloxane composition according to claim 1, wherein the hydrosilyl group-containing compound (b) is a hydrosilyl group-containing cyclic siloxane.

4. The polysiloxane composition according to claim 1, wherein the hydrosilyl group-containing compound (b) is a hydrosilyl group-terminated straight-chain siloxane.

5. The polysiloxane composition according claim 1, wherein the alkenyl group-containing polyhedral polysiloxane compound (a) comprises a siloxane unit represented by the following formula:

wherein a+b is an integer of 6 to 24, provided that a represents an integer of 1 or more, and b represents an integer of 0 or 1 or more; A represents an alkenyl group; $R^1$ represents an alkyl group or an aryl group; and $R^2$ represents a hydrogen atom, an alkyl group, an aryl group, or a group bonded to another polyhedral polysiloxane.

6. The polysiloxane composition according to claim 1, wherein the modified polyhedral polysiloxane (A) is obtained by adding to the alkenyl group-containing polyhedral polysiloxane compound (a) an excessive amount of the hydrosilyl group-containing compound (b) such that the number of hydrogen atoms directly bonded to Si atoms of the compound (b) is 2.5 to 20 per alkenyl group of the polyhedral polysiloxane compound (a), to carry out the modification, and then evaporating an unreacted portion of the hydrosilyl group-containing compound (b).

7. The polysiloxane composition according to claim 1, wherein the modified polyhedral polysiloxane (A) contains at least three hydrosilyl groups in a molecule.

8. The polysiloxane composition according to claim 1, wherein the modified polyhedral polysiloxane (A) comprises a structural unit represented by the following formula:

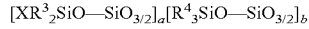

wherein a+b is an integer of 6 to 24, provided that a represents an integer of 1 or more, and b represents an integer of 0 or 1 or more; $R^3$ represents an alkyl group or an aryl group; $R^4$ represents an alkenyl group, a hydrogen atom, an alkyl group, an aryl group, or a group bonded to another polyhedral polysiloxane; and X has a structure represented by the following formula (1) or (2), and in the case where multiple Xs are present, the structures of the Xs may be the same as or different from one another:

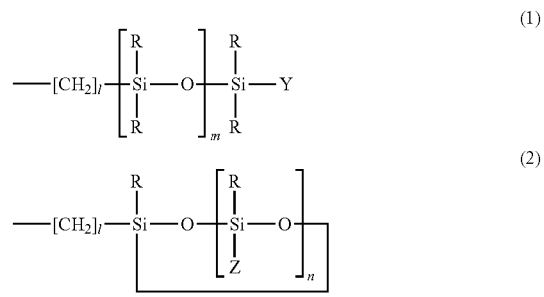

wherein l represents an integer of 2 or more; m represents an integer of 0 or more; n represents an integer of 2 or more; Y represents a hydrogen atom, an alkenyl group, an alkyl group, an aryl group, or a moiety bonded to a polyhedral polysiloxane via an alkylene chain, and Ys may be the same as or different from one another; Z represents a hydrogen atom, an alkenyl group, an alkyl group, an aryl group, or a moiety bonded to a polyhedral polysiloxane via an alkylene chain, and Zs may be the same as or different from one another, provided that at least one of Y and Z is a hydrogen atom.

9. The polysiloxane composition according to claim 1, comprising a hydrosilylation catalyst.

10. The polysiloxane composition according to claim 1, comprising a curing retardant.

11. The polysiloxane composition according to claim 1, comprising an adhesion promoter.

12. The polysiloxane composition according to claim 1, comprising an inorganic filler.

13. A cured article, obtained by using the polysiloxane composition according to claim 1.

14. The cured article according to claim 13, wherein the cured article has at least one loss tangent peak measured at a frequency of 10 Hz in a temperature range of −40° C. to 50° C.

15. An optical device, obtained by using the polysiloxane composition according to claim 1.

16. The optical device according to claim 15, comprising an encapsulant for optical elements which is obtained by using the polysiloxane composition.

17. The polysiloxane composition according to claim 1, wherein the aryl group in the organopolysiloxane (B) is in an amount of 0.1 to 10 mmol/g.

* * * * *